United States Patent
Choi

(10) Patent No.: US 12,094,536 B2
(45) Date of Patent: Sep. 17, 2024

(54) MEMORY DEVICE AND PROGRAM OPERATION METHOD THEREOF

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 225 days.

(21) Appl. No.: 17/833,013

(22) Filed: Jun. 6, 2022

(65) Prior Publication Data
US 2023/0290412 A1  Sep. 14, 2023

(30) Foreign Application Priority Data
Mar. 8, 2022 (KR) .......... 10-2022-0029259

(51) Int. Cl.
*G11C 16/10* (2006.01)
*G11C 16/24* (2006.01)
*G11C 16/34* (2006.01)

(52) U.S. Cl.
CPC .............. *G11C 16/10* (2013.01); *G11C 16/24* (2013.01); *G11C 16/3459* (2013.01)

(58) Field of Classification Search
CPC ..... G11C 16/10; G11C 16/24; G11C 16/3459; G11C 11/5628; G11C 16/0483; G11C 16/08
USPC ................................... 365/185.22
See application file for complete search history.

(56) References Cited

U.S. PATENT DOCUMENTS

| | | | | |
|---|---|---|---|---|
| RE46,238 E | * | 12/2016 | Kang | G11C 11/5628 |
| 9,552,883 B1 | * | 1/2017 | Jung | G11C 16/12 |
| 9,672,914 B1 | * | 6/2017 | Park | G11C 16/0483 |
| 10,424,369 B2 | | 9/2019 | Harada | |
| 2012/0127791 A1 | * | 5/2012 | Lee | G11C 16/0483 365/185.03 |
| 2022/0293197 A1 | * | 9/2022 | Prakash | G11C 16/10 |
| 2022/0399063 A1 | * | 12/2022 | Amin | H10B 43/10 |

FOREIGN PATENT DOCUMENTS

| | | |
|---|---|---|
| KR | 1020150091684 A | 8/2015 |
| KR | 1020190073943 A | 6/2019 |

* cited by examiner

*Primary Examiner* — Fernando Hidalgo
(74) *Attorney, Agent, or Firm* — WILLIAM PARK & ASSOCIATES LTD.

(57) ABSTRACT

A memory device includes: a memory cell array including a plurality of memory cells; a peripheral circuit coupled to the memory cell array through word lines and bit lines, and suitable for performing one or more program loops on memory cells that are coupled to a selected word line of the word lines, each program loop including a program voltage application operation and a program verification operation; and a program control circuit suitable for controlling the peripheral circuit to decrease a level of a precharge voltage that is applied to the bit lines during the program verification operation when the number of program loops that are performed is greater than a reference number.

15 Claims, 14 Drawing Sheets

Vth distribution of MLC CELL

Vth distribution of TLC CELL

MEMORY DEVICE AND PROGRAM OPERATION METHOD THEREOF

CROSS-REFERENCE TO RELATED APPLICATION

The present application claims the benefit of Korean Patent Application No. 10-2022-0029259, filed on Mar. 8, 2022, which is incorporated herein by reference in its entirety.

BACKGROUND

1. Field

Various embodiments of the present invention relate to a semiconductor design technology, and more particularly, to a program operation of a nonvolatile memory device.

2. Description of the Related Art

Memory devices may be classified into volatile and nonvolatile memory devices.

Non-volatile memory devices perform a read/write operation at a relatively lower speed than volatile memory devices but retain stored data even when a power supply is cut off. Accordingly, non-volatile memory devices are frequently used in portable electronic devices for storing data which need to be retained regardless of whether or not power is supplied to the device.

Examples of non-volatile memory devices include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like.

Flash memories may store data of a single bit or data of two bits or more in one memory cell. Typically, a memory cell storing data of a single bit is called a single level cell (SLC) and a memory cell storing data of two bits or more is called a multi-level cell (MLC). The SLC has an erase state and a program state according to a threshold voltage. The MLC has an erase state and a plurality of program states according to a threshold voltage.

Recently, various methods for reducing the current consumption during the program operation of the flash memory have been attempted.

SUMMARY

According to an embodiment of the present invention, a memory device includes a memory cell array including a plurality of memory cells; a peripheral circuit coupled to the memory cell array through word lines and bit lines, and suitable for performing one or more program loops on memory cells that are coupled to a selected word line of the word lines, each program loop including a program voltage application operation and a program verification operation; and a program control circuit suitable for controlling the peripheral circuit to decrease a level of a precharge voltage that is applied to the bit lines during the program verification operation when the number of program loops that are performed is greater than a reference number.

According to an embodiment of the present invention, a memory device includes a memory cell array including a plurality of memory cells; a peripheral circuit coupled to the memory cell array through word lines and bit lines, and suitable for performing one or more program loops on memory cells that are coupled to a selected word line of the word lines, each program loop including a program voltage application operation and a program verification operation; and a program control circuit suitable for controlling the peripheral circuit to decrease a level of a precharge voltage that is applied to the bit lines during the program verification operation when the number of program loops that are performed is smaller than or equal to a reference number.

According to an embodiment of the present invention, a program method of a memory device include setting a program permission voltage and a program inhibit voltage of a plurality of bit lines; performing a program voltage application operation of applying a program voltage to memory cells that are coupled to a selected word line of a plurality of word lines; and performing a program verification operation of verifying a program result by precharging the bit lines using a precharge voltage and applying a verification voltage to the memory cells that are coupled to the selected word line, wherein the setting, the program voltage application operation, and the program verification operation are repeatedly performed, and wherein a level of the precharge voltage during the program verification operation is decreased when the number of program loops that are performed is greater than a reference number, each program loop including the program voltage application operation and the program verification operation.

According to an embodiment of the present invention, a program method of a memory device include setting a program permission voltage and a program inhibit voltage of a plurality of bit lines; performing a program voltage application operation of applying a program voltage to memory cells that are coupled to a selected word line of a plurality of word lines; and performing a program verification operation of verifying a program result by precharging the bit lines using a precharge voltage and applying a verification voltage to the memory cells that are coupled to the selected word line, wherein the setting, the program voltage application operation, and the program verification operation are repeatedly performed, and wherein a level of the precharge voltage during the program verification operation is decreased when the number of program loops that are performed is smaller than or equal to a reference number, each program loop including the program voltage application operation and the program verification operation.

DETAILED DESCRIPTION

Figure 1:
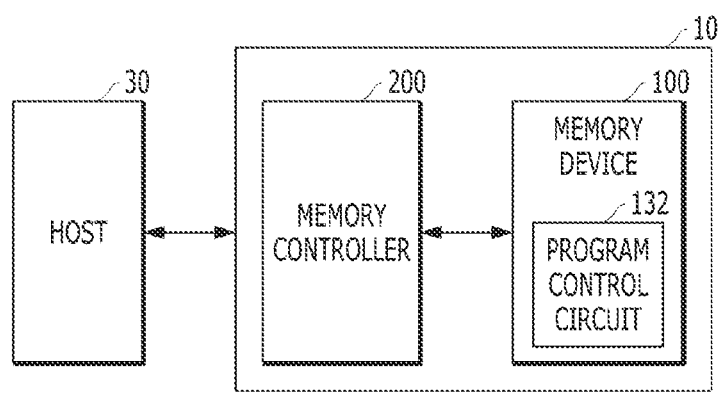
FIG. 1 is a block diagram illustrating a memory system in accordance with an embodiment of the present disclosure.

Specific structural and functional description provided herein is directed to embodiments of the present disclosure. The present invention, however, is not limited to the embodiments described herein.

While embodiments are described in detail, the present invention is not limited to any specific detail. The present disclosure may be embodied in many different forms and should not be construed as being limited to any specific description. Rather, the present invention should be construed to cover not only the disclosed embodiments, but also various alternatives, modifications, equivalents, and other embodiments that fall within the spirit and scope of the present disclosure.

It will be understood that, although the terms "first", "second", etc. may be used herein to identify various elements, these elements should not be limited by these terms. These terms are only used to distinguish one element from another element that otherwise have the same or similar names. A first element in one instance could be termed a second element in another instance without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that open ended terms, such as "comprise", "include", "have", etc., when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art may be omitted to avoid obscuring the subject matter of the present disclosure. This aims to omit unnecessary description to make the subject matter of the present disclosure clear.

Various embodiments of the present disclosure are described more fully below with reference to the accompanying drawings, in which preferred embodiments of the present disclosure are shown, so that those skilled in the art can easily carry out and practice the present disclosure.

Embodiments of the present invention are directed to a memory device capable of adjusting a level of a precharge voltage that is applied to a plurality of bit lines during a program verification operation according to the number of program loops that are performed including a program voltage applying operation and the program verification operation.

According to embodiments of the present invention, the memory device may stabilize the average current consumption by reducing internal current consumption (ICC) generated during a program verification operation.

FIG. 1 is a block diagram illustrating a memory system 10 in accordance with an embodiment of the present disclosure.

Referring to FIG. 1, the memory system 10 may include a memory device 100 and a memory controller 200.

The memory system 10 may be configured to store data under the control of a host 30 such as a cellular phone, a smartphone, an MP3 player, a laptop computer, a desktop computer, a game machine, a television (TV), a tablet personal computer (PC), or an in-vehicle infotainment system.

The memory system 10 may be implemented as any one of the various kinds of storage devices depending on a host interface, which is a communication system with the host 30. For example, the memory system 10 may be configured as any of various kinds of storage devices, such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-e or PCIe) type storage device, a compact flash (CF) card, a smart media card, and/or a memory stick.

The memory system 10 may be manufactured in the form of any of various package types. For instance, the memory system 10 may be manufactured as a package on package (POP) type, a system in package (SIP) type, a system on chip (SOC) type, a multi-chip package (MCP) type, a chip on board (COB) type, a wafer-level fabricated package (WFP) type, and/or a wafer-level stack package (WSP) type.

The memory device 100 may store data therein. The memory device 100 may operate under the control of the memory controller 200. The memory device 100 may include a memory cell array including a plurality of memory cells configured to store data therein. The memory cell array may include a plurality of memory blocks. Each memory block may include a plurality of memory cells. The memory block may be the unit of erasing data that is stored in the memory device 100. In an embodiment, the memory block may include a plurality of pages. The page may be the unit of storing data in the memory device 100 or reading data from the memory device 100.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, by way of example, it is assumed that the memory device 100 is a NAND flash memory.

In an embodiment, the memory device 100 may be embodied in a three-dimensional array structure. The present disclosure may be applied not only to a flash memory in which a charge storage layer is formed of a conductive floating gate (FG), but also to a charge trap flash (CTF) memory in which a charge storage layer is formed of an insulating layer.

The memory device 100 may receive a command and an address from the memory controller 200 and access an area of the memory cell array that is selected by the address. In other words, the memory device 100 may perform an operation corresponding to the command on the area that is selected by the address. For example, the memory device 100 may perform a program operation, a read operation, and an erase operation. During the program operation, the memory device 100 may store data in a memory cell area that is selected by an address. During the read operation, the memory device 100 may read stored data from the memory cell area that is selected by the address. During the erase operation, the memory device 100 may erase data from a memory cell area that is selected by an address.

In an embodiment, the memory device 100 may include a program control circuit 132. The memory device 100 may perform a program operation that stores data in a memory cell area according to a program command that is provided by the memory controller 200. The program operation may include one or more program loops. Each of the program loops may include a program voltage application operation for applying a program voltage, and a program verification operation for verifying a program result by using a verification voltage. The program control circuit 132 may control the number of program loops that are performed according to a program state for improved program performance. Meanwhile, all bit lines may be precharged into a precharge voltage during the program verification operation. In an embodiment, the program control circuit 132 may adjust a level of the precharge voltage that is applied to the bit lines during the program verification operation according to the number of program loops that are performed, thereby reducing internal current consumption (ICC). A detailed configuration and operation of the memory device according to embodiments of the present invention will be described using drawings described below.

The memory controller 200 may control overall operations of the memory system 10. When power is applied to the memory system 10, the memory controller 200 may execute firmware (FW). In the case in which the memory device 100 is a flash memory device, the memory controller 200 may execute firmware, such as a flash translation layer (FTL), for controlling communication between the host 30 and the memory device 100.

If a write request is received from the host 30, the memory controller 200 may receive, from the host 30, data to be stored and a logical address for identifying the corresponding data. The memory controller 200 may translate the input logical address into a physical address for indicating physical addresses of memory cells, among the memory cells in the memory device 100, in which data is to be stored. The memory controller 200 may provide, to the memory device 100, a program command for storing data, a translated physical address, and data to be stored.

If a read request is received from the host 30, the memory controller 200 may receive, from the host 30, a logical address for identifying data to be read. The memory controller 200 may obtain a physical address corresponding to the input logical address and may provide a read command and a physical address to the memory device 100.

During an erase operation, the memory controller 200 may provide an erase command and a physical address to the memory device 100.

In an embodiment, the memory controller 200 may autonomously control the memory device 100 to perform a program operation, a read operation, or an erase operation, regardless of a request from the host 30. For example, the memory controller 200 may control the memory device 100 to perform background operations, such as a wear leveling operation, a garbage collection operation, and a read reclaim operation.

The host 30 may communicate with the memory system by using at least one of various communication methods, such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and/or load reduced DIMM (LRDIMM) communication methods.

Figure 2:
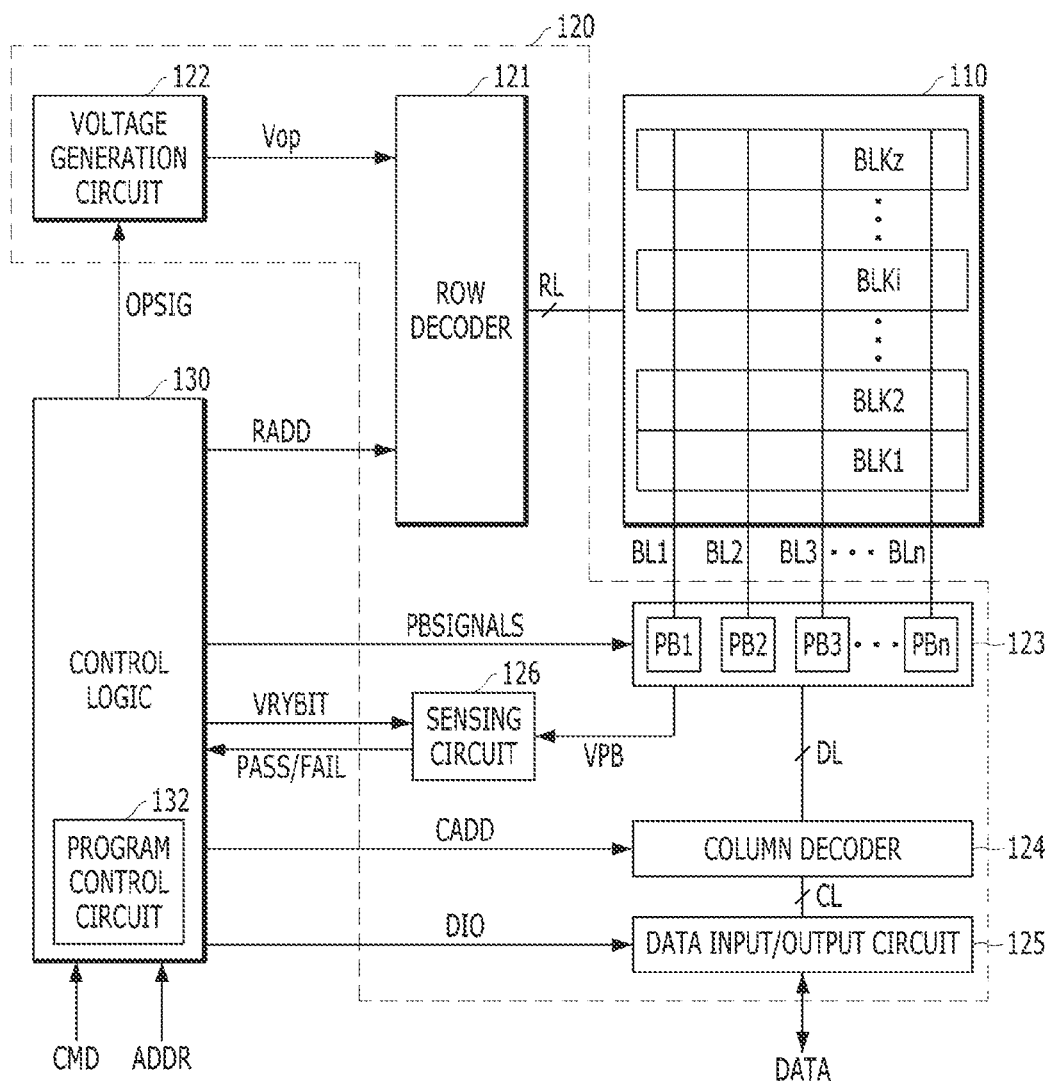
FIG. 2 is a block diagram illustrating a memory device shown in FIG. 1 in accordance with an embodiment of the present disclosure.

FIG. 2 is a block diagram illustrating the memory device 100 shown in FIG. 1 in accordance with an embodiment of the present disclosure.

Referring to FIG. 2, the memory device 100 may include a memory cell array 110, a peripheral circuit 120, and a control logic 130. The control logic 130 may include the program control circuit 132 of FIG. 1.

The memory cell array 110 may include a plurality of memory blocks BLK1 to BLKz. Each of the memory blocks BLK1 to BLKz may have a three-dimensional (3D) structure. Each of the memory blocks BLK1 to BLKz may include a plurality of memory cells that are stacked on a substrate. The memory blocks BLK1 to BLKz may be connected to the peripheral circuit 120 through a plurality of row lines RL and may be connected to the peripheral circuit 120 through a plurality of bit lines BL1 to BLn. The memory blocks BLK1 to BLKz may be coupled in common to first to n-th bit lines BL1 to BLn.

In an embodiment, the plurality of memory cells may be nonvolatile memory cells. The row lines RL may include at least one source select line, a plurality of word lines, and at least one drain select line. Memory cells that are coupled to the same word line may be defined as one page. Hence, each memory block may include a plurality of pages.

Each of the memory cells in the memory cell array 110 may be formed as a single level cell (SLC) that is capable of storing data of a single bit, a multi-level cell (MLC) that is capable of storing data of two bits, a triple-level cell (TLC) that is capable of storing data of three bits, or a quad-level cell (QLC) that is capable of storing data of four bits.

The peripheral circuit 120 may perform a program operation, a read operation, or an erase operation on a selected area of the memory cell array 110 under the control of the control logic 130. The peripheral circuit 120 may drive the memory cell array 110. For example, under the control of the control logic 130, the peripheral circuit 120 may apply various operating voltages to the row liens RL and the first to n-th bit lines BL1 to BLn or discharge the applied voltages. The program operation may include one or more program loops. Each of the program loops may include a program voltage application operation for applying a program voltage and a program verification operation for verifying a program result by using a verification voltage. The peripheral circuit 120 may perform one or more program loops including the program voltage application and the program verification operation on memory cells that are coupled to selected one of the row lines RL.

In detail, the peripheral circuit 120 may include a row decoder 121, a voltage generation circuit 122, a page buffer group 123, column decoder 124, a data input/output circuit 125, and a sensing circuit.

The row decoder 121 may be coupled to the cell array 110 through the row lines RL. The row decoder 121 may operate under the control of the control logic 130. The row decoder 121 may receive a row address RADD from the control logic 130. In an embodiment, the row decoder 121 may decode the row address RADD to select at least one of the memory blocks BLK1 to BLKz. In an embodiment, the row decoder 121 may decode the row address RADD to select any one row line RL of the selected memory block and may transmit operating voltages Vop that is generated by the voltage generation circuit 122 to the selected row line RL.

For example, during the program voltage application operation, the row decoder 121 may apply a program voltage to a selected word line and may apply a program pass voltage having a level that is lower than that of the program voltage to unselected word lines. During the program verification operation, the row decoder 121 may apply a verification voltage to a selected word line and apply a verification pass voltage having a level that is higher than that of the verification voltage to unselected word lines. During the read operation, the row decoder 121 may apply a read voltage to a selected word line and apply a read pass voltage having a level that is higher than that of the read voltage to unselected word lines. During the erase operation, the row decoder 121 may decode the row address RADD to select a memory block. During the erase operation, the row decoder 121 may apply a ground voltage to word lines that are coupled to the selected memory block.

In an embodiment, the row decoder 121 may include components, such as an address buffer, a decoder, and the like.

The voltage generation circuit 122 may generate a plurality of voltages by using an external supply voltage that is supplied to the memory device 100. The voltage generation circuit 122 may operate under the control of the control logic 130. In detail, the voltage generation circuit 122 may generate the operating voltages Vop that are used for the program operation, the read operation, and the erase operation, according to an operation signal OPSIG. For example, the voltage generation circuit 122 may generate the program voltage, the verification voltage, the pass voltage, the verification pass voltage, the read voltage, and an erase voltage.

Depending on an embodiment, the voltage generation circuit 122 may generate an internal supply voltage by regulating the external supply voltage. The internal supply voltage that is generated by the voltage generation circuit 122 may be used as an operating voltage for the memory device 100. Depending on an embodiment, the voltage generation circuit 122 may generate the operating voltages Vop by using the external supply voltage or the internal supply voltage. For example, the voltage generation circuit 122 may include a plurality of pumping capacitors for receiving the internal supply voltage and may generate the operating voltages Vop by selectively enabling the plurality of pumping capacitors under the control of the control logic 130. The generated operating voltages Vop may be supplied to the memory cell array 110 by the row decoder 121.

The page buffer group 123 may include first to n-th page buffers PB1 to PBn. The first to n-th page buffers PB1 to PBn may be coupled to memory cells of the memory cell array 110 through the bit lines BL, respectively. The first to n-th page buffers PB1 to PBn may operate under the control of the control logic 130. For example, the first to n-th page buffers PB1 to PBn may operate in response to page buffer control signals PBSIGNALS. The first to n-th page buffers PB1 to PBn may temporarily store data that is transferred through the first to n-th bit lines BL1 to BLn, and sense voltage, or current of the first to n-th bit lines BL1 to BLn.

In an embodiment, during the program voltage application operation when the program voltage is applied to the selected word line, the first to n-th page buffers PB1 to PBn may receive data to be stored in the memory cell array 110, from the data input/output circuit 125 through data lines DL. The data that is received to the first to n-th page buffers PB1 to PBn may be stored in the memory cells of the selected word line. Threshold voltages of memory cells that are coupled to a bit line to which a program permission voltage (e.g., a ground voltage) is applied may be increased, and threshold voltages of memory cells that are coupled to a bit line to which a program inhibit voltage (e.g., a power supply voltage) is applied may be maintained.

In an embodiment, during the program verification operation, the first to n-th page buffers PB1 to PBn may read out data from selected memory cells through the first to n-th bit lines BL1 to BLn. During the program verification operation, the first to n-th page buffers PB1 to PBn may precharge all bit lines to the precharge voltage. In an embodiment, the first to n-th page buffers PB1 to PBn may adjust a level of the precharge voltage that is applied to the bit lines during the program verification operation according to the buffer control signals PBSIGNALS, thereby reducing the internal current consumption (ICC).

In an embodiment, during the read operation, the first to n-th page buffers PB1 to PBn may read out data from selected memory cells through the first to n-th bit lines BL1 to BLn and may output the read data to the data input/output circuit 125 under the control of the column decoder 124. During the erase operation, the first to n-th page buffers PB1 to PBn may float the first to n-th bit lines BL1 to BLn.

The column decoder 124 may operate under the control of the control logic 130. The column decoder 124 may transfer data between the data input/output circuit 125 and the page buffer group 123 in response to a column address CADD that is provided from the control logic 130. For example, the column decoder 124 may exchange data with the first to n-th page buffers PB1 to PBn through the data lines DL or may exchange data with the data input/output circuit 125 through the column lines CL.

The data input/output circuit 125 may receive/output the data from/to the memory controller 200 of FIG. 1. The data input/output circuit 125 may be coupled to the first to n-th page buffers PB1 to PBn through the data lines DL. The data input/output circuit 125 may operate under the control of the control logic 130. Depending on an embodiment, the data input/output circuit 125 may include a plurality of input/output buffers (not shown) for receiving/outputting the data in response to input/output control signals DIO that are provided from the control logic 130. During the program operation, the data input/output circuit 125 may receive the data to be stored from the memory controller 200. During the read operation, the data input/output circuit 125 may output, to the memory controller 200, the data from the first to n-th page buffers PB1 to PBn.

The sensing circuit 126 may generate a reference current in response to an enable bit signal VRYBIT that is generated by the control logic 130 and may output a pass or fail signal PASS/FAIL to the control logic 130 by comparing a sensing voltage VPB that is received from the page buffer group 123 with a reference voltage that is generated by the reference current.

The control logic 130 may be coupled to the row decoder 121, the voltage generation circuit 122, the page buffer group 123, the column decoder 124, the data input/output circuit 125, and the sensing circuit 126. The control logic 130 may control the overall operation of the memory device 100. The control logic 130 may be operated in response to a command CMD and an address ADDR that is transmitted from an external device. The control logic 130 may control the peripheral circuit 120 by generating various types of signals in response to the command CMD and the address ADDR. For example, the control logic 130 may generate the operation signal OPSIG, the row address RADD, the page buffer control signals PBSIGNALS, the column address CADD, the input/output control signals DIO, and the enable bit signal VRYBIT in response to the command CMD and the address ADDR. The control logic 130 may output the operation signal OPSIG to the voltage generation circuit 122, output the row address RADD to the row decoder 121, output the page buffer control signals PBSIGNALS to the page buffer group 123, output the column address CADD to the column decoder 124, output the input/output control signals DIO to the data input/output circuit 125, and output the enable bit signal VRYBIT to the sensing circuit 126. In addition, the control logic 130 may determine whether a verification operation has passed or failed in response to the pass or fail signal PASS/FAIL that is output from the sensing circuit 126.

In an embodiment, the control logic 130 may include the program control circuit 132.

The sensing circuit 126 may output the pass or fail signal PASS/FAIL, denoting whether the program verification operation has passed or failed, to the control logic 130. The program control circuit 132 may provide the page buffer control signals PBSIGNALS to the page buffer group 123 in response to the pass or fail signal PASS/FAIL to control the precharge voltage of the first to n-th bit lines BL1 to BLn during the program verification operation. For example, when the fail signal FAIL is input to the control logic 130, the program control circuit 132 may determine whether the number of program loops that are performed is greater than a preset reference number and may provide the page buffer control signals PBSIGNALS to the first to n-th page buffers PB1 to PBn for adjusting a level of the precharge voltage that is applied to the first to n-th bit lines BL1 to BLn during the program verification operation based on the determination result.

Figure 3:
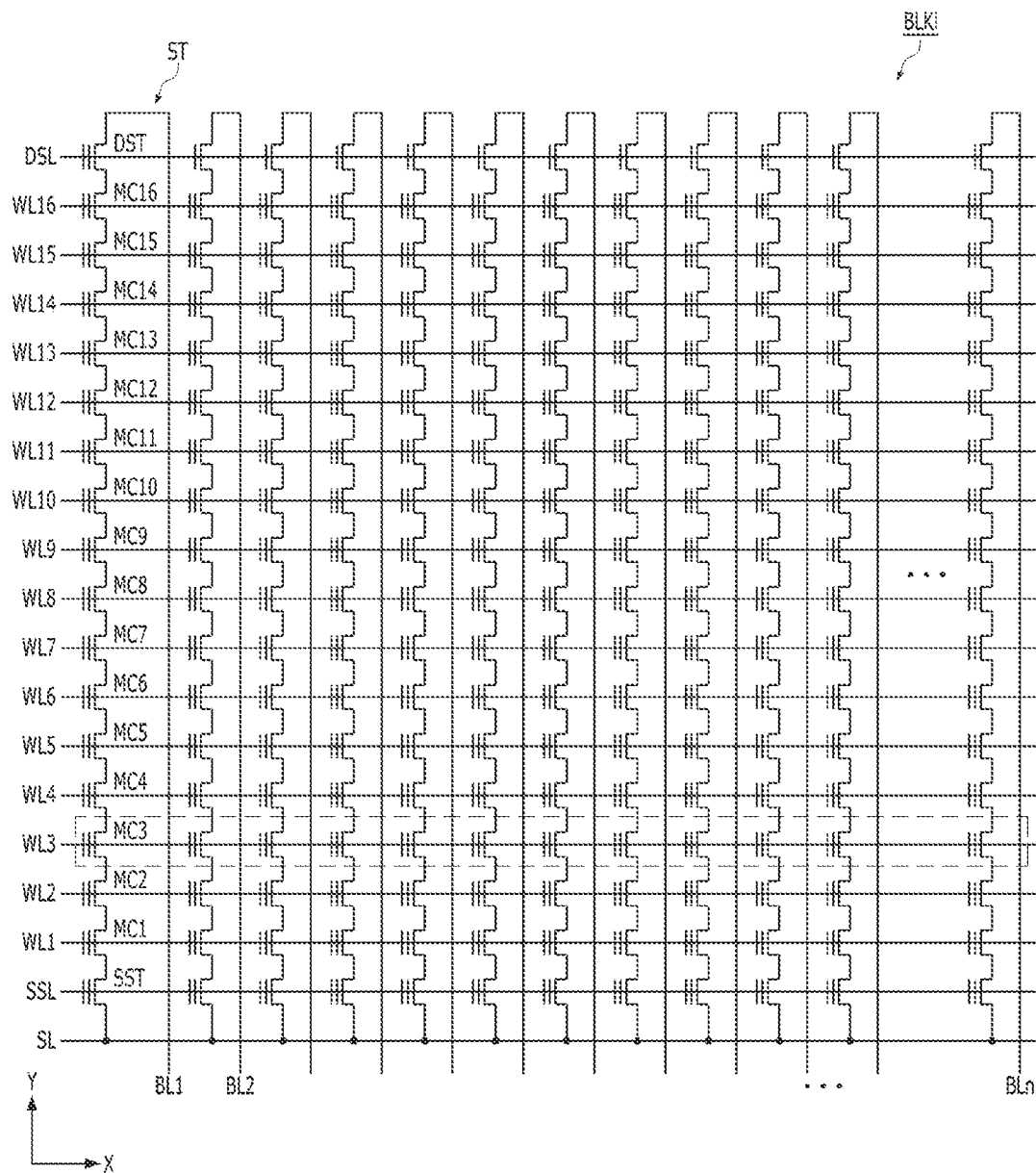
FIG. 3 is a diagram illustrating a structure of a representative memory block of a plurality of memory blocks of FIG. 2.

FIG. 3 is a diagram illustrating a structure of a representative memory block BLKi of the plurality of memory blocks BLK1 to BLKz of FIG. 2.

Referring to FIG. 3, in the memory block BLKi, a plurality of word lines WL1 to WL16, arranged parallel to each other, may be coupled between a first select line SSL and a second select line DSL. The first select line may be a source select line, and the second select line DSL may be a drain select line. In more detail, the memory block BLKi may include a plurality of strings ST that are coupled between a plurality of bit lines BL1 to BLn and a source line SL. The bit lines BL1 to BLn may be respectively coupled to the strings ST, and the source line SL may be coupled in common to the strings ST. The strings ST may have the same configuration; therefore, the string ST that is coupled to the first bit line BL1 is described in detail by way of example.

The string ST may include a source select transistor SST, a plurality of memory cells MC1 to MC16, and a drain select transistor DST, which are coupled in series to each other between the source line SL and the first bit line BL1. At least one source select transistor SST and at least one drain select transistor DST may be included in each string ST, and more than sixteen memory cells, i.e., MC1 to MC16, shown in FIG. 3, may be included in each string ST.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. The gates of the source select transistors SST in different strings ST may be coupled to the source select line SSL. The gates of the drain select transistors DST may be coupled to the drain select line DSL. The gates of the memory cells MC1 to MC16 may be coupled to the plurality of word lines WL1 to WL16. Among the memory cells in different strings ST, a group of memory cells that are coupled to each word line may be referred to as a physical page PG. Therefore, the number of physical pages PG in the memory block BLKi may correspond to the number of word lines WL1 to WL16.

In FIG. 3, the source line SL, the source select line SSL, the word lines WL1 to WL16, and the drain select line DSL may correspond to the row lines RL of FIG. 2. That is, the source line SL, the source select line SSL, the word lines WL1 to WL16, and the drain select line DSL may be controlled by the row decoder 121 of FIG. 2. The common source line SL may be controlled by the control logic 130.

In the case in which each memory cell is a single level cell (SLC) that is capable of storing data of one bit, each physical page PG may store one logical page (LPG) of data. Each memory cell may store data of two or more bits. In this case, each physical page PG may store two or more LPGs of data.

Figure 4A:
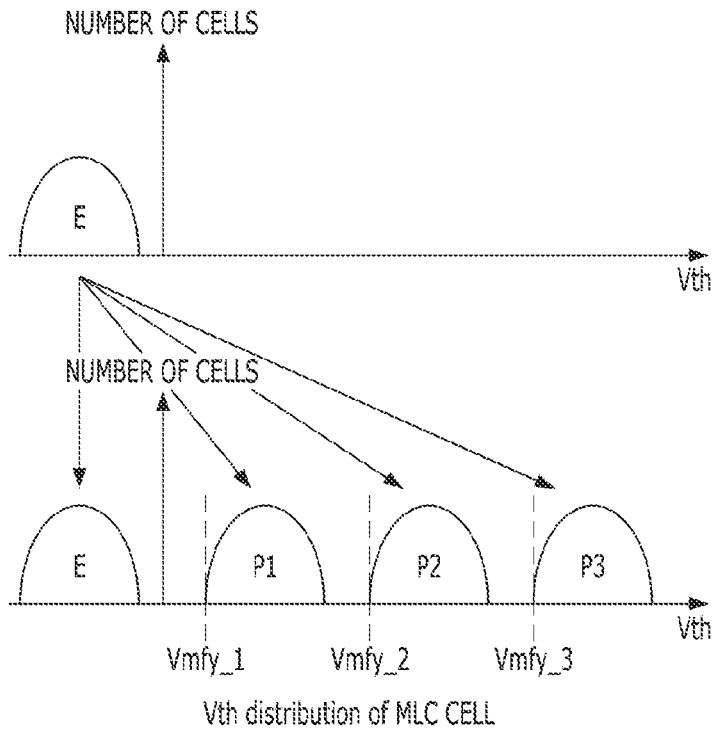
FIGS. 4A and 4B are diagrams illustrating an exemplary program operation of a memory device.
Figure 4B:
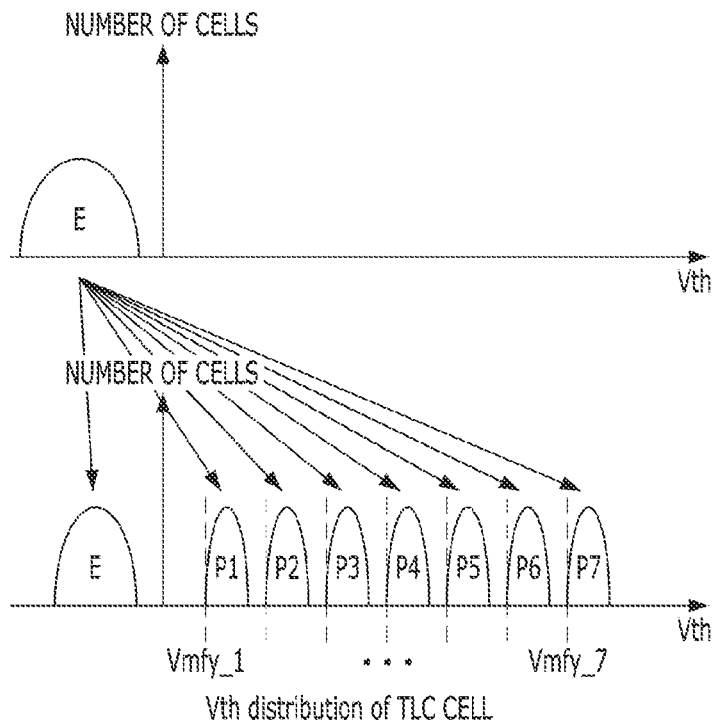

FIGS. 4A and 4B are diagrams illustrating an exemplary program operation of a memory device.

Referring to FIGS. 4A and 4B, program operations of MLC memory cells and TLC memory cells are shown. The program operation may an operation for storing data into memory cells that are coupled to a selected word line.

FIG. 4A is a diagram illustrating a threshold voltage (Vth) distribution of MLC memory cells, each of which can store data of two bits when a program operation is performed.

Referring to FIG. 4A, each of the MLC memory cells may have an erased state E or any one of first to third programmed states P1 to P3 as a target programmed state. The target programmed state may be determined depending on data to be stored in each memory cell. Each of the MLC memory cells may be in the erased state E before the program operation is performed. Thereafter, as the program operation is performed, each of the MLC memory cells may reach the target programmed state. The program operation may be performed on each page including a plurality of memory cells that are coupled to one word line. The memory cell array may include a plurality of pages. A page to be programmed among the plurality of pages may be determined based on an address. If the program operation on the corresponding page is terminated, a program operation on a subsequent page may be performed.

The program operation may include a program voltage application operation and a program verification operation. The program voltage application operation may be an operation of applying a program voltage to a selected word line that is coupled in common to memory cells that are included in the corresponding page on which the program operation is to be performed. The program verification operation may be an operation of verifying a program result by using a verification voltage. Memory cells, each having a first programmed state P1 as a target programmed state, may be memory cells on which a program verification operation that uses a first multi-verification voltage Vmfy_1 has passed. Memory cells, each having a second programmed state P2 as a target programmed state, may be memory cells on which a program verification operation that uses a second multi-verification voltage Vmfy_2 has passed. Memory cells, each having a third programmed state P3 as a target programmed state, may be memory cells on which a program verification operation that uses a third multi-verification voltage Vmfy_3 has passed. If all of the memory cells that are coupled to the selected word line reaches the target programmed states, the program operation on the select word line may be regarded as having been terminated.

FIG. 4B is a diagram illustrating a threshold voltage (Vth) distribution of TLC memory cells, each of which can store three bits data when a program operation is performed.

Referring to FIG. 4B, each of the TLC memory cells may have an erased state E or any one of first to seventh programmed states P1 to P7 as a target programmed state. Although a method of performing a program operation is similar to that of FIG. 4A, the number of threshold voltage distributions to be generated in the program operation on the TLC memory cells may be greater than that of the program operation on MLC memory cells because each TLC memory cell can store three bits data. In other words, referring to FIGS. 4A and 4B, when the program operation on the MLC memory cells is completed, a total four threshold voltage distributions may be generated. However, when the program operation on the TLC memory cells is completed, a total eight threshold distributions may be generated. Although the amount of data that can be stored in a TLC memory cell is greater than the amount of data that can be stored in an MLC memory cell, a program time for TLC memory cells may be longer than that of MCL memory cells because the number of threshold voltage distributions that are required to be generated for the TLC memory cells is greater than that of the MLC memory cells. Although it will be assumed that memory cells are TLC memory cells for the sake of explanation in the following embodiment, the present invention is not limited thereto.

Meanwhile, the program operation may be performed by an incremental step pulse program (ISPP) scheme in which the level of the program voltage to be applied to the selected word line is increased by a predetermined step voltage Vstep as the program loop is performed.

Figure 5:
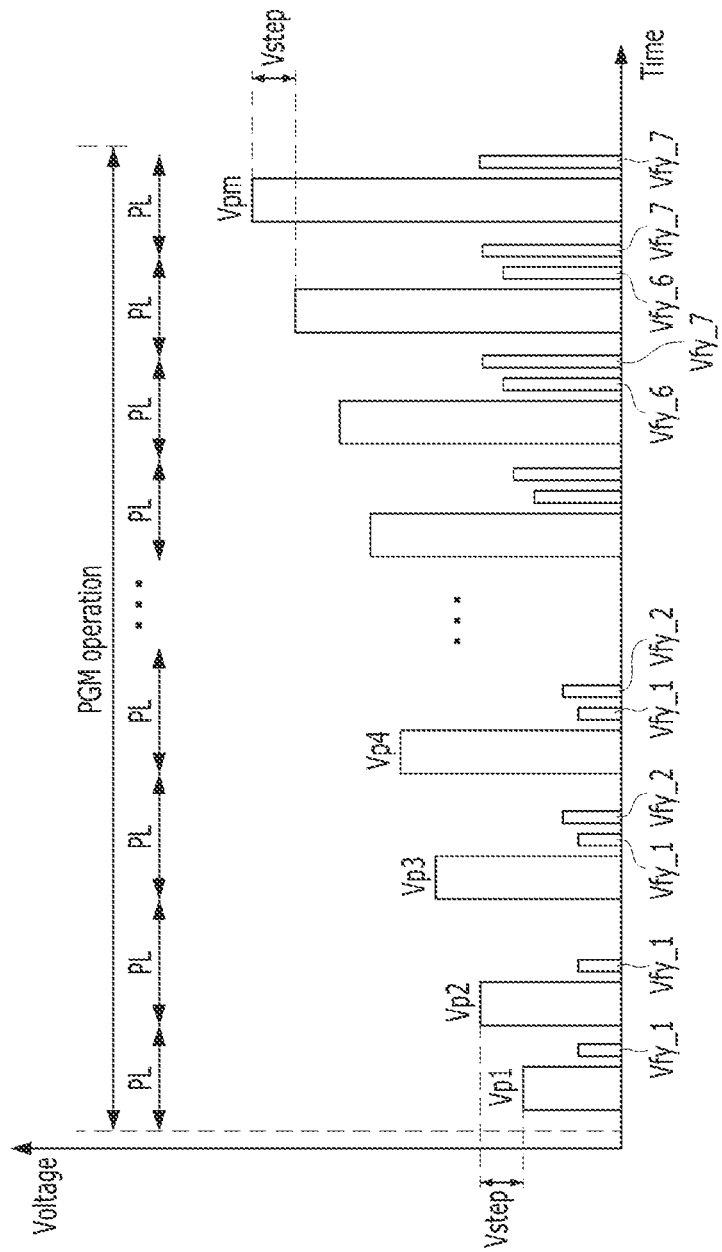
FIG. 5 is a timing diagram illustrating a program operation according to an incremental step pulse program (ISPP) scheme.

FIG. 5 is a timing diagram illustrating a program operation according to the ISPP scheme.

Referring to FIG. 5, a memory cell on which a program operation is to be performed may have any one of first to seventh programmed states P1 to P7 as a target programmed state.

The program operation may be an operation of increasing a threshold voltage of a memory cell. The program operation may be performed by an iteration of at least one program loop PL. Each program loop may include a program voltage application operation of applying a program voltage and a program verification operation of determining whether the threshold voltage of the memory cell exceeds a verification voltage. The program voltage application operation may be an operation of increasing the threshold voltage of the memory cell. The verification operation may be an operation of checking the threshold voltage of the corresponding memory cell and determining whether the memory cell has reached a target programmed state. At each iteration of the program loops PL, the level of the program voltage to be applied to the selected word line may increase by a predetermined step voltage Vstep. This scheme is referred to as the ISPP scheme.

In detail, a program operation may be performed on memory cells that are coupled to a selected word line in response to a program command that is provided by the memory controller 200, described with reference to FIG. 1. The memory cells that are coupled to the selected word lines may be in an erased state E before the program operation is performed. As the program operation is performed, threshold voltage distributions of the memory cells may be shifted. In other words, threshold voltage distributions of memory cells having the first to seventh programmed states P1 to P7 as target programmed states, other than memory cells that remain in the erased state E, may be shifted.

Detailed description of performing a program operation on a selected word line in accordance with an embodiment is given below. To perform a program operation, a program loop may be performed on memory cells, each having a first programmed state P1 as a target programmed state. The voltage of a bit line that is coupled to memory cells, each having the first programmed state P1 as the target programmed state, may be set to a program permission voltage (e.g., a ground voltage). If a first program voltage Vp1 is applied to the selected word line, the corresponding memory cells may be programmed. Subsequently, a program verification operation of verifying a result of programming the memory cell to the first programmed state P1 may be performed. During the program verification operation, a first verification voltage Vfy_1 may be applied to the selected word line, thereby sensing whether the threshold voltage of the memory cell is greater than the verification voltage. For example, if the result of the sensing indicates "1", this may mean that the threshold voltage of the memory cell is lower than the first verification voltage Vfy_1. If it is determined that the threshold voltage of the memory cell having the first programmed state P1 as the target programmed state is lower than the first verification voltage Vfy_1, this may indicate that the program operation has failed. If the result of the sensing indicates "0", this may mean that the threshold voltage of the memory cell is greater than the first verification voltage Vfy_1. If it is determined that the threshold voltage of the memory cell having the first programmed state P1 as the target programmed state is higher than the first verification voltage Vfy_1, this may indicate that the program operation has passed.

If a result of the program verification operation indicates that the program operation has failed for the first programmed state P1, a subsequent program loop PL may be performed. The voltage of the bit line that is coupled to the memory cell on which the program operation has failed may be set to a program permission voltage. In the subsequent program loop PL, a program voltage that is higher by a step voltage Vstep than the program voltage that is applied to the selected word line in the previous program loop PL may be applied to the selected word line. In the ISPP scheme, a second program voltage Vp2 that is higher by the step voltage Vstep than the first program voltage Vp1 that has been applied to the selected word line in the previous program loop PL may be applied to the selected word line. The step voltage Vstep may be a fixed size. After the second program voltage Vp2 has been applied, the program verification operation of checking whether the memory cell has been programmed to the first programmed state P1 may be performed again. In the same manner as the previous program verification operation, the first verification voltage Vfy_1 may be applied to the selected word line. Hence, the threshold voltage of the memory cell may be sensed. In an embodiment, the size of the step voltage Vstep of the increment of the program voltage that increases each time the program loop PL is iterated may be varied. For example, in the previous program loops PL, it is assumed that program voltages increase by a single unit of the step voltage Vstep for each program loop that has been applied. If a result of performing the program verification operation indicates that the program operation has failed, a program voltage that increases by 2 units of the step voltage Vstep rather than the single unit of the step voltage Vstep of the previous program loops PL, depending on the state of the memory cell, may be applied to the selected word line in a subsequent program loop PL.

In an embodiment, a program verification operation that is performed in each program loop PL may use two or more verification voltages. In other words, after a program voltage has been applied, memory cells having two or more programmed states as target programmed states may be verified. For example, after a third program voltage Vp3 has been applied to the selected word line, a program verification operation for the first programmed state P1 and the second programmed state P2 may be performed. To verify a result of the program operation for the first programmed state P1, a first verification voltage Vfy_1 may be applied to the selected word line. Hence, the threshold voltage of the memory cell may be sensed. Subsequently, to verify a result of the program operation for the second programmed state P2, a second verification voltage Vfy_2 may be applied to the selected word line. Hence, the threshold voltage of the memory cell may be sensed. If the result of the sensing indicates 1, the program operation may be regarded as having failed. In this case, the program voltage to be applied to the selected word line may increase by a step voltage Vstep, and then a subsequent program loop PL may be performed.

As a result of performing the program voltage application operation and the program verification operation, a memory cell that is determined to have passed is no longer programmed in subsequent program loops PL. Therefore, before a program voltage is applied in a subsequent program loop PL, a program inhibit voltage (e.g., a power supply voltage) may be applied to a bit line that is coupled to the memory cell that has passed the program verification operation. The memory cell that is coupled to the bit line to which the program inhibit voltage has been applied might not be programmed even if a program voltage is applied to the corresponding word line. Hence, over-programming may be prevented.

Meanwhile, in the program verification operation, when a verification voltage is applied to the selected word line after all bit lines are precharged, a pass or fail may be identified based on a cell current flowing through the precharged bit lines. Since all bit lines are precharged during the program verification operation, the internal current consumption (ICC) increases rapidly. In particular, when the memory cell stores data of two bits or more, current consumption may increase toward the second half of the repeated program loop. Accordingly, internal current consumption may increase more rapidly.

Hereinafter, in accordance with an embodiment of the present invention, in the case in which the memory cell stores data of two bits or more, a method of reducing the internal current consumption by decreasing a level of a precharge voltage that is applied to bit lines during a program verification operation when the number of program loops that are performed exceeds a preset reference number will be described.

Figure 6:
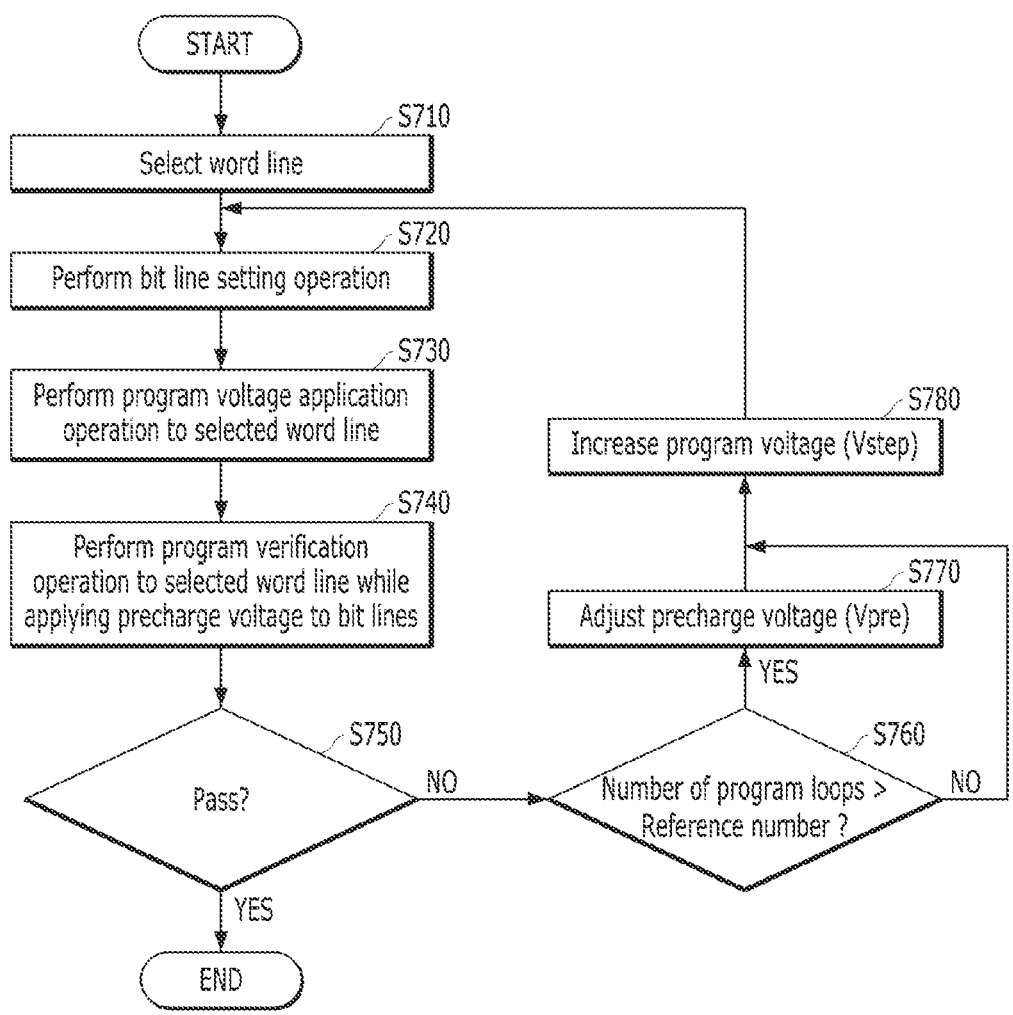
FIG. 6 is a flow chart for describing a program operation in accordance with an embodiment of the present disclosure.

FIG. 6 is a flow chart for describing a program operation in accordance with an embodiment of the present disclosure.

Referring to FIG. 6, the peripheral circuit 120 may decode the row address RADD that is provided from the control logic 130 to select any one word line on which the program operation is to be performed (at S710). In an embodiment, a first word line (e.g., WL1) may be selected first in the memory block.

The peripheral circuit 120 may perform a program loop on memory cells that are coupled to the selected word line under the control of the control logic 130.

First, the peripheral circuit 120 may perform a bit line setting operation in response to the page buffer control signals PBSIGNALS provided from the control logic 130 (at S720). For example, the peripheral circuit 120 may set a program permission voltage to a ground voltage and a program inhibit voltage to a power supply voltage. The peripheral circuit 120 may apply the program permission voltage to bit lines of program target cells and may apply the program inhibit voltage to bit lines of program inhibit cells.

In response to the operation signal OPSIG provided from the control logic 130, the peripheral circuit 120 may apply a program voltage to the selected word line and may apply a program pass voltage to unselected word lines. Accordingly, a program voltage application operation of memory cells that are connected to the selected word line may be performed (at S730).

Another cell strings ST may be connected to a bit line that is connected to a cell string ST including the program target cell in a memory block. In addition, the cell strings ST that share the bit line in the memory block may share word lines. Accordingly, the program permission voltage, the program voltage, and the program pass voltage may be equally applied to the cell strings ST sharing the bit line. In order to program only the selected cell string ST while inhibiting the remaining unselected cell strings ST from being programed, the peripheral circuit 120 may apply a turned-on voltage (e.g., a power supply voltage) to the drain selection line DSL of the selected cell string ST and a turned-off voltage (e.g., a ground voltage) to the drain selection line DSL of the remaining unselected cell strings ST. As a result, since the channel region of the selected cell string ST remains grounded, the threshold voltage of the program target cell may rise according to a difference from the program voltage. Further, channel boosting occurs since the channel region of the unselected cell strings ST becomes floated, and the threshold voltage of the program inhibit cell does not increase as the channel voltage increases.

Thereafter, the peripheral circuit 120 may perform a program verification operation of the memory cells that are connected to the selected word line under the control of the control logic 130 (at S740). First, the peripheral circuit 120 may precharge all bit lines by applying a precharge voltage to the bit lines in response to the page buffer control signals PBSIGNALS. Then, in response to the operation signal OPSIG, the peripheral circuit 120 may apply a verification voltage to the selected word line while applying a verification pass voltage to unselected word lines. The peripheral circuit 120 may sense a cell current flowing through the bit line according to the sensing voltage VPB and may output the pass or fail signal PASS/FAIL to the control logic 130 according to the sensing result.

The control logic 130 may determine whether the program verification operation has passed or failed in response to the pass or fail signal PASS/FAIL (at S750).

When it is determined that the program verification operation has failed ("NO" of S750), the control logic 130 may verify whether the number of program loops that are performed (that is, the number of times the program loop is executed) is greater than a preset reference number. When the number of program loops that are performed is smaller than or equal to the reference number ("NO" of S760), the peripheral circuit 120 may increase a level of the program voltage that is applied to the selected word line by a predetermined step voltage Vstep in response to the operation signal OPSIG (at S780). Thereafter, steps S720 to S750 may be repeatedly performed. For reference, although not shown in FIG. 6, when the number of program loops that are performed reaches a maximum allowance number, the program operation for the selected word line may end as a failure.

When the number of program loops that are performed is greater than the reference number ("YES" of S760), the control logic 130 may control the peripheral circuit 120 to decrease a level of the precharge voltage that is applied to the bit lines during the program verification operation (at S770). For example, the control logic 130 may provide the page buffer control signals PBSIGNALS to the page buffer group 123 to decrease the level of the precharge voltage by a first level Vpre during the program verification operation of step S740. At this time, the memory cells in the memory cell array 110 may be formed as the MLC memory cells that are capable of storing data of two bits, the TLC memory cells that are capable of storing data of three bits, the QLC memory cells that are capable of storing data of four bits, or other memory cells that are capable of storing data of five or more bits. Thereafter, the peripheral circuit 120 may increase the level of the program voltage by the step voltage Vstep (at S780), and steps S720 to S750 may be repeatedly performed.

When it is determined that the program verification operation has passed ("YES" of S750), the program operation on the selected word line may be finished.

Figure 7:
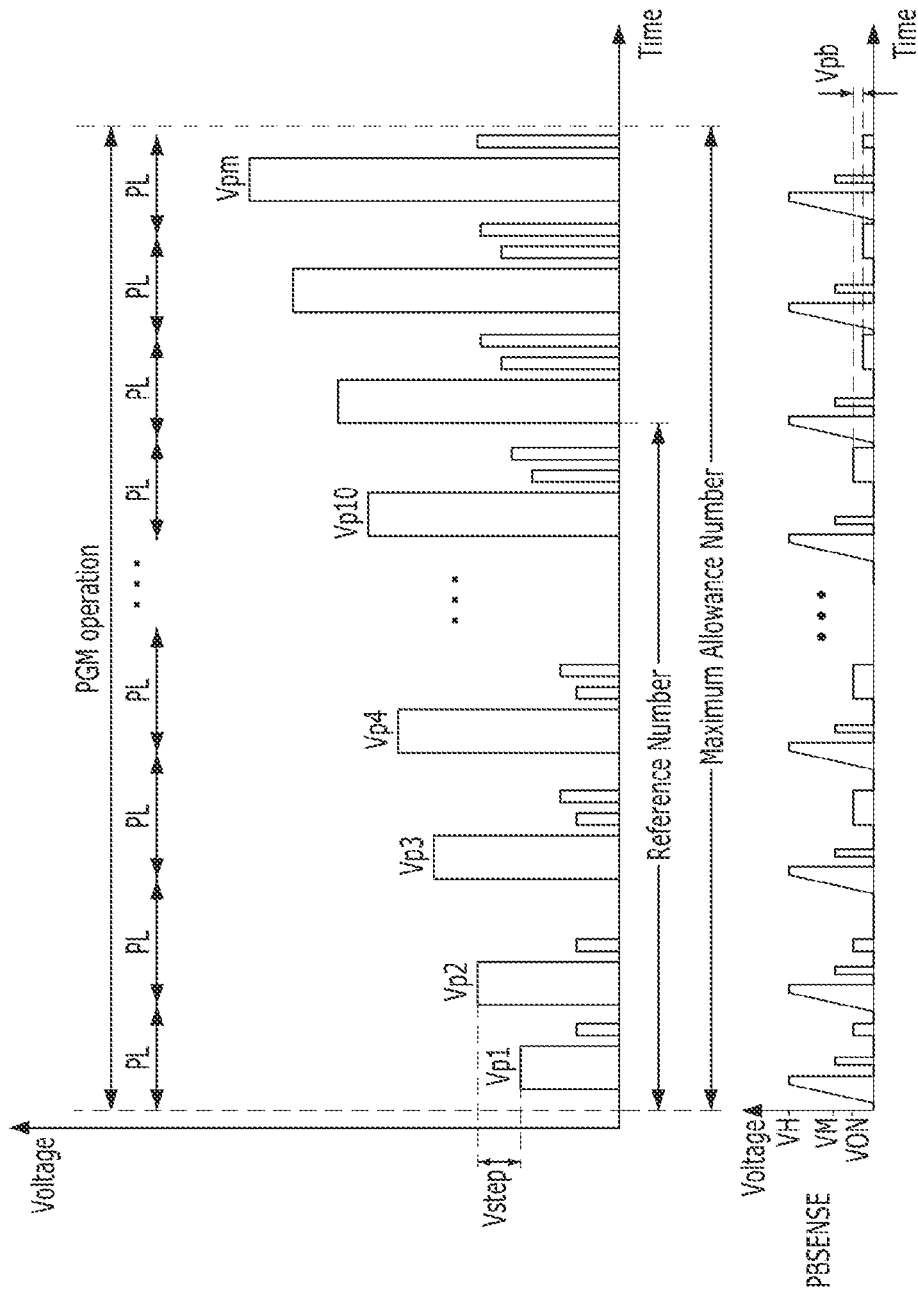
FIG. 7 is a timing diagram illustrating the program operation of FIG. 6.

FIG. 7 is a timing diagram illustrating the program operation of FIG. 6.

Referring to FIG. 7, a program operation in a case in which a memory cell stores data of two bits or more is illustrated. The program operation may be performed by repeating at least one program loop PL within a maximum allowance number of times (e.g., m times). One program loop PL may include a program voltage application operation and one or more program verification operations. As described with reference to FIG. 5, when performing a program operation of an ISPP scheme, the level of the program voltage that is applied to the selected word line may increase by the step voltage Vstep whenever the program loop PL is repeated.

When the number of program loops that are performed exceeds the reference number, the level of the precharge voltage that is applied to the bit lines, during the program verification operation of the program loop PL, may be reduced by the first level Vpre.

In an embodiment of the present invention, as a method for adjusting the level of the precharge voltage that is applied to the bit lines, a voltage level of a sensing control signal PBSENSE that controls a switch (410 of FIG. 11) for connecting the page buffers and the bit lines, respectively, may be adjusted. The voltage level of the sensing control signal PBSENSE may be controlled by the page buffer control signals PBSIGNALS that are provided from the control logic 130. During the program verification operation, after providing the sensing control signal PBSENS of a high voltage (VH) level to fully turn on the switch 410, the control logic 130 may provide the sensing control signal PBSENS of a middle voltage (VM) level in order to apply a voltage that is higher than a ground voltage to a bit line to which a program permission voltage (e.g., a ground voltage) is applied. Thereafter, the control logic 130 may provide a sensing control signal PBSENSE of the turn-on voltage VON to apply a precharge voltage to the bit lines during the program verification operation. Then, the control logic 130 may provide the sensing control signal PBSENSE of a turn-on voltage VON to apply a precharge voltage to the bit lines during the program verification operation. In an embodiment, in the case in which the number of program loops that are performed exceeds the reference number, the control logic 130 may control the voltage level of the sensing control signal PBSENSE to be reduced by a predetermined first level Vpb from the turn-on voltage VON, thereby reducing the precharge voltage that is applied to the bit lines by the first level Vpre, during the program verification operation. For example, as shown in FIG. 7, when the reference number is set to 10, the voltage level of the sensing control signal PBSENSE in the program verification operation from the 11th program loop may be reduced by the first level Vpb compared to the sensing control signal PBSENSE of the previous program loop (i.e., the 10th program loop).

As described above, in the embodiment of the present invention, when the memory cell stores data of two or more bits, the level of the precharge voltage that is applied to the bit lines may be reduced when the number of program loops that are performed exceeds the reference number. Accordingly, the average current consumption may be stabilized by reducing the internal current consumption that is generated during the program verification operation.

Figure 8:
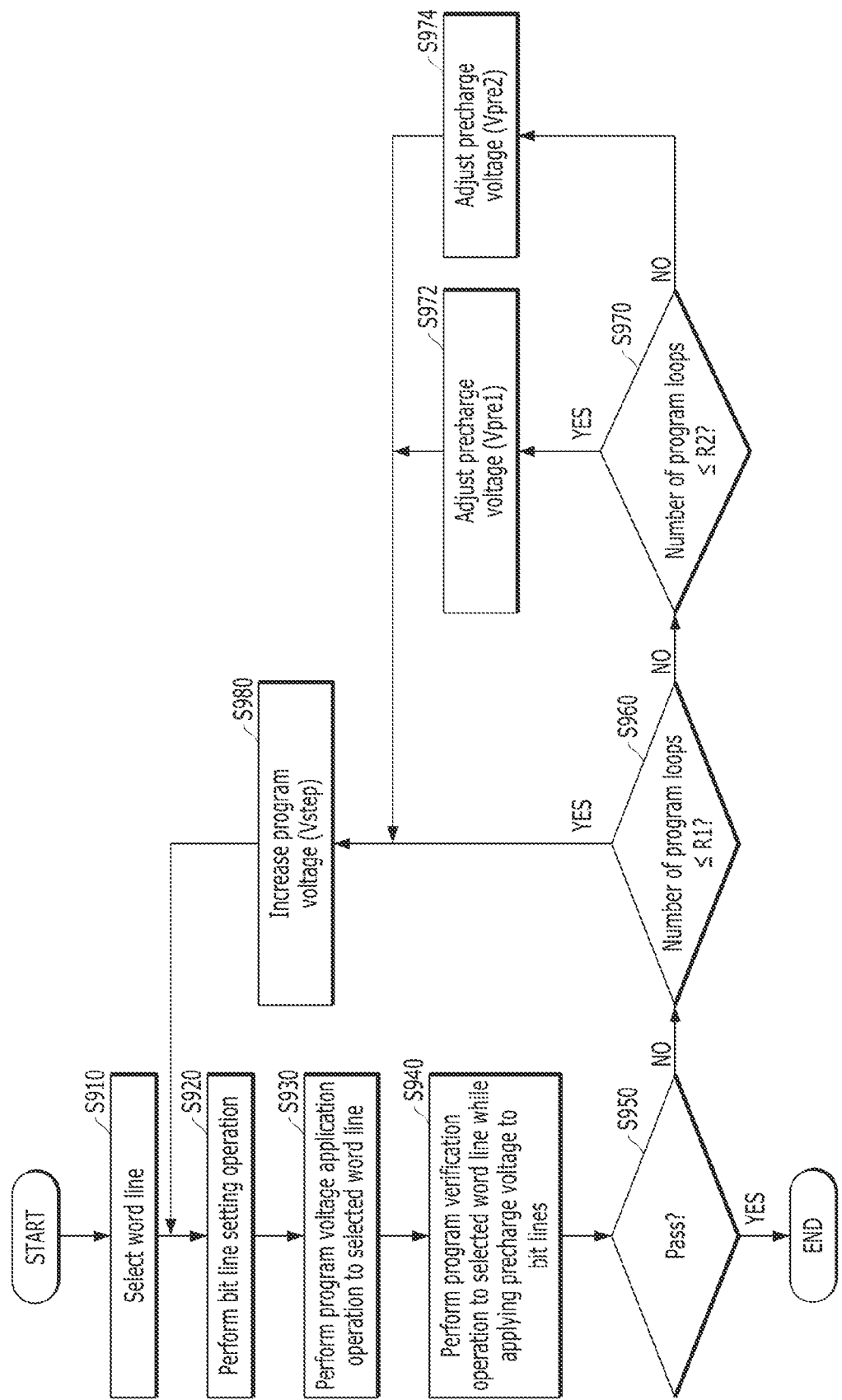
FIG. 8 is a flow chart for describing a program operation in accordance with another embodiment of the present disclosure.

FIG. 8 is a flow chart for describing a program operation in accordance with another embodiment of the present disclosure.

Referring to FIG. 8, the peripheral circuit 120 may select any one word line on which the program operation is to be performed (at S910).

The peripheral circuit 120 may perform a program loop on memory cells that are coupled to the selected word line. First, the peripheral circuit 120 may perform a bit line setting operation by applying a program permission voltage to bit lines of program target cells and applying a program inhibit voltage to bit lines of program inhibit cells (at S920).

The peripheral circuit 120 may perform a program voltage application operation of the selected word line by applying a program voltage to the selected word line and applying a program pass voltage to unselected word lines (at S930). As described with reference to FIG. 6, the peripheral circuit 120 may apply the turned-on voltage to the drain selection line DSL of the selected cell string ST and the turned-off voltage to the drain selection line DSL of the remaining unselected cell strings ST, thereby raising the threshold voltage of the program target cell without raising threshold voltage of the program inhibit cell.

Thereafter, the peripheral circuit 120 may perform a program verification operation of the selected word line (at S940). The peripheral circuit 120 may precharge all bit lines by applying a precharge voltage to the bit lines and may apply a verification voltage to the selected word line while applying a verification pass voltage to unselected word lines. The peripheral circuit 120 may sense a cell current flowing through the bit line according to the sensing voltage VPB and may output the pass or fail signal PASS/FAIL to the control logic 130 according to the sensing result.

The control logic 130 may determine whether the program verification operation has passed or failed in response to the pass or fail signal PASS/FAIL (at S950).

When it is determined that the program verification operation has failed ("NO" of S950), the control logic 130 may verify whether the number of program loops that are performed (that is, the number of times the program loop is executed) is smaller than or equal to a first reference number (R1). When the number of program loops that are performed is smaller than or equal to the first reference number (R1) ("YES" of S960), the peripheral circuit 120 may increase a level of the program voltage that is applied to the selected word line by a predetermined step voltage Vstep (at S980). Thereafter, steps S920 to 9750 may be repeatedly performed until the number of program loops that are performed reaches a maximum allowance number.

When the number of program loops that are performed is greater than the first reference number (R1) ("NO" of S960), the control logic 130 may verify whether the number of program loops that are performed is smaller than or equal to a second reference number (R2). At this time, the second reference number (R2) may be greater than the first reference number (R1).

When the number of program loops that are performed is smaller than or equal to the second reference number (R2) ("YES" of S970), the control logic 130 may control the peripheral circuit 120 to decrease a level of the precharge voltage that is applied to the bit lines during the program verification operation (at S972). For example, the control logic 130 may provide the page buffer control signals PBSIGNALS to the page buffer group 123 to decrease the level of the precharge voltage by a first level Vpre1 during the program verification operation of step S940. At this time, the memory cells in the memory cell array 110 may be formed as the MLC memory cells that are capable of storing data of two bits, the TLC memory cells that are capable of storing data of three bits, the QLC memory cells that are capable of storing data of four bits, or other memory cells that are capable of storing data of five or more bits. Thereafter, the peripheral circuit 120 may increase the level of the program voltage by the step voltage Vstep (at S980), and steps S920 to S950 may be repeatedly performed.

When the number of program loops that are performed is greater than the second reference number (R2) ("NO" of S970), the control logic 130 may control the peripheral circuit 120 to decrease a level of the precharge voltage that is applied to the bit lines during the program verification operation (at S974). For example, the control logic 130 may provide the page buffer control signals PBSIGNALS to the page buffer group 123 to decrease the level of the precharge voltage by a second level Vpre2 during the program verification operation of step S940. Depending on the embodiment, the first level Vpre1 may have the same level as that of the second level Vpre2. Depending on the embodiment, the first level Vpre1 may be set to a level that is different from the second level Vpre2. Thereafter, the peripheral circuit 120 may increase the level of the program voltage by the step voltage Vstep (at S980), and steps S920 to S950 may be repeatedly performed.

When it is determined that the program verification operation has passed ("YES" of S950), the program operation on the selected word line may be finished.

Figure 9:
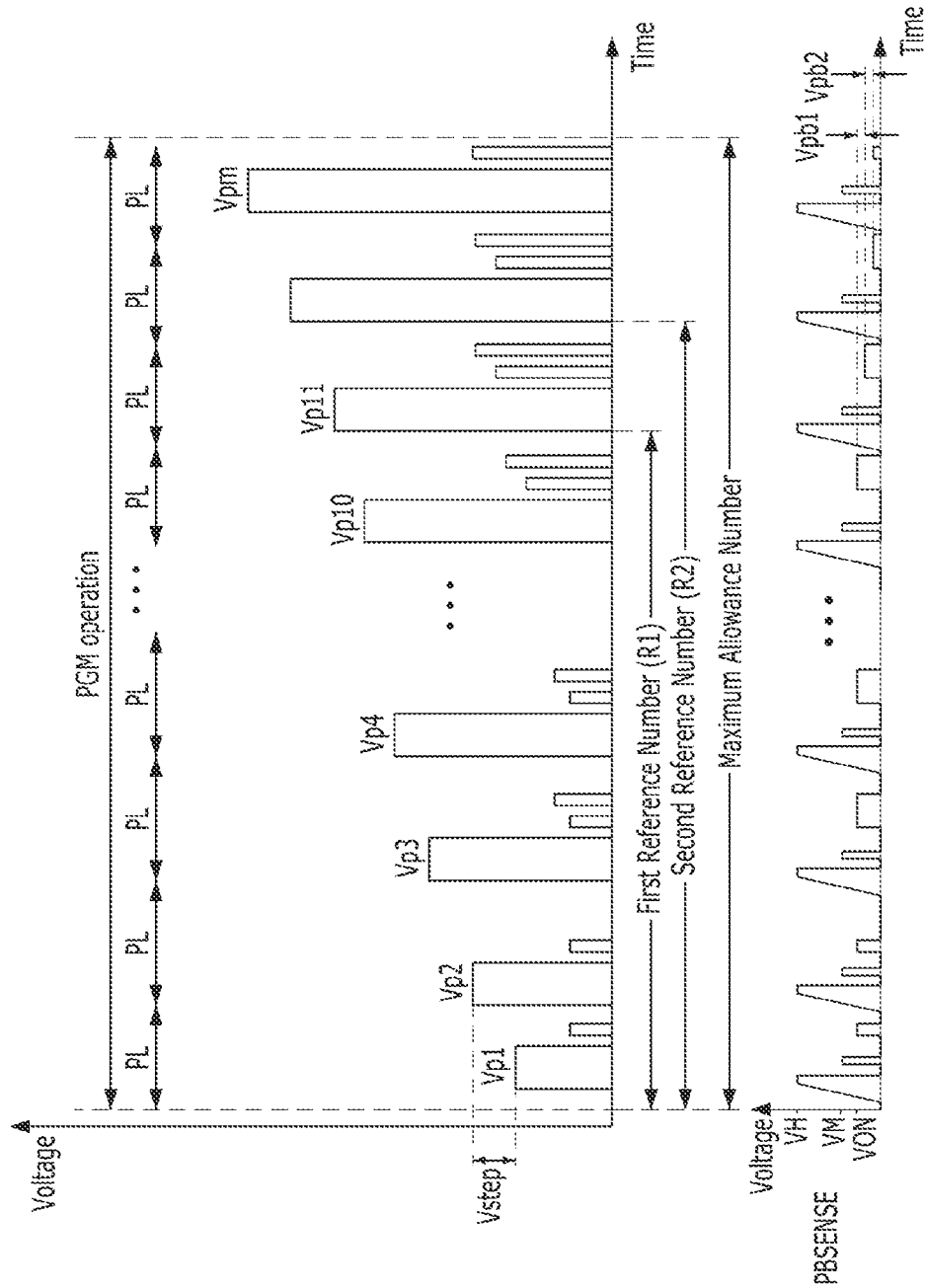
FIG. 9 is a timing diagram illustrating the program operation of FIG. 8.

FIG. 9 is a timing diagram illustrating the program operation of FIG. 8.

Referring to FIG. 9, a program operation in a case in which a memory cell stores data of two bits or more is illustrated. When the number of program loops that are performed exceeds the first reference number (R1) and smaller than or equal to the second reference number (R2), the level of the precharge voltage that is applied to the bit lines during the program verification operation of the program loop PL may be reduced by the first level Vpre1. Further, when the number of program loops that are performed exceeds the second reference number (R2), the level of the precharge voltage that is applied to the bit lines during the program verification operation of the program loop PL may be reduced by the second level Vpre2.

In an embodiment of the present invention, the control logic 130 may control a voltage level of the sensing control signal PBSENSE to be reduced by a predetermined level Vpb1 or Vpb2 from a turn-on voltage VON, thereby reducing the precharge voltage that is applied to the bit lines by the first level Vpre1 or the second level Vpre2, during the program verification operation. For example, as shown in FIG. 9, when the first reference number (R1) is set to 10 and the second reference number (R2) is set to 11, the voltage level of the sensing control signal PBSENSE in the program verification operation from the 11th program loop may be reduced by a first level Vpb1 compared to the sensing control signal PBSENSE of the previous program loop (i.e., the 10th program loop). Furthermore, the voltage level of the sensing control signal PBSENSE in the program verification operation from the 12th program loop may be reduced by a second level Vpb2 compared to the sensing control signal PBSENSE of the previous program loop (i.e., the 11th program loop).

As described above, in the embodiment of the present invention, a plurality of reference numbers may be set, and whenever the number of program loops that are performed exceeds each reference number, the level of the precharge voltage that is applied to the bit lines in the program verification operation may be sequentially reduced. Accordingly, the average current consumption may be stabilized by reducing the internal current consumption that is generated during the program verification operation.

Figure 10A:
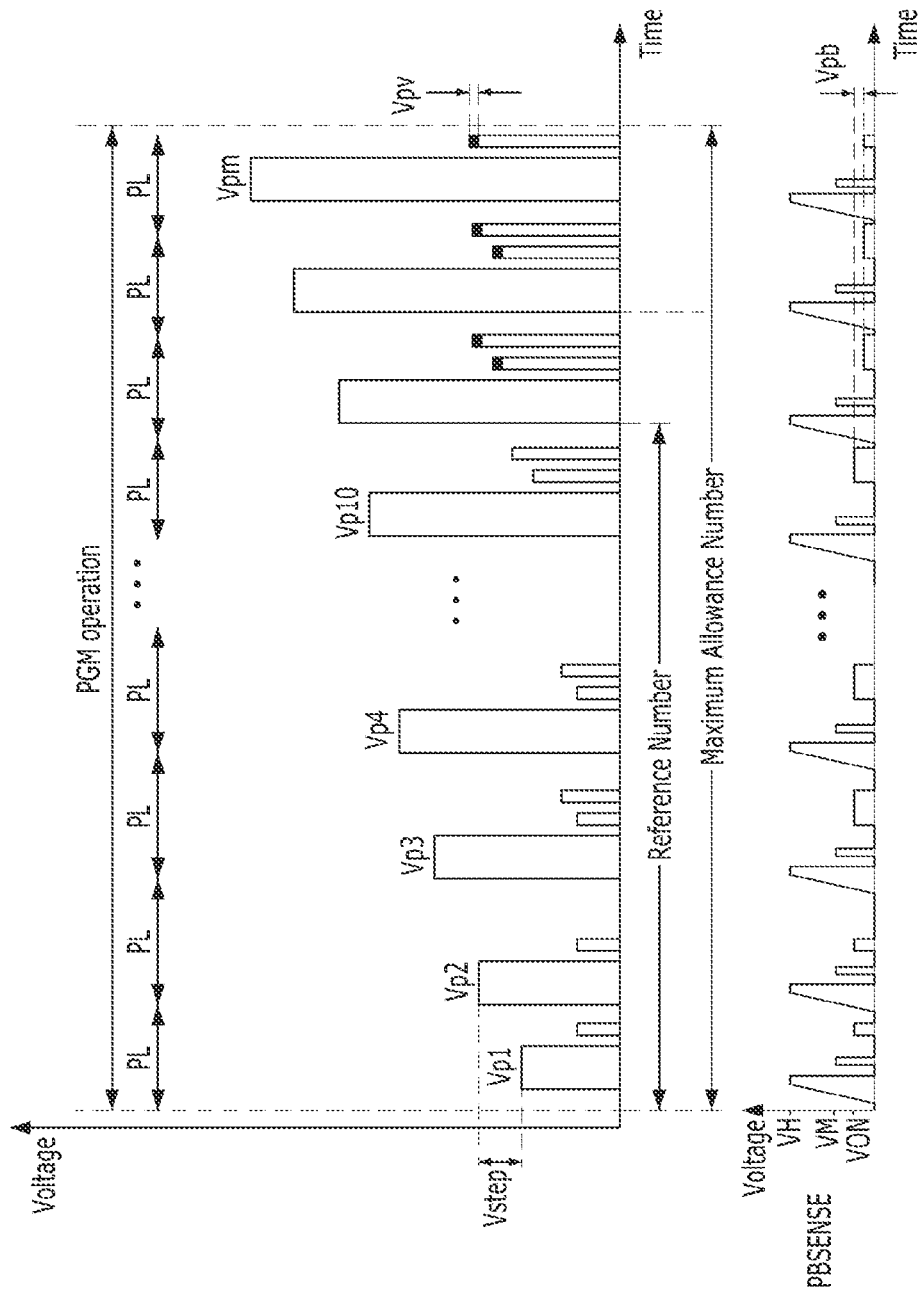
FIGS. 10A and 10B are timing diagrams illustrating a program operation in accordance with another embodiment of the present disclosure.
Figure 10B:
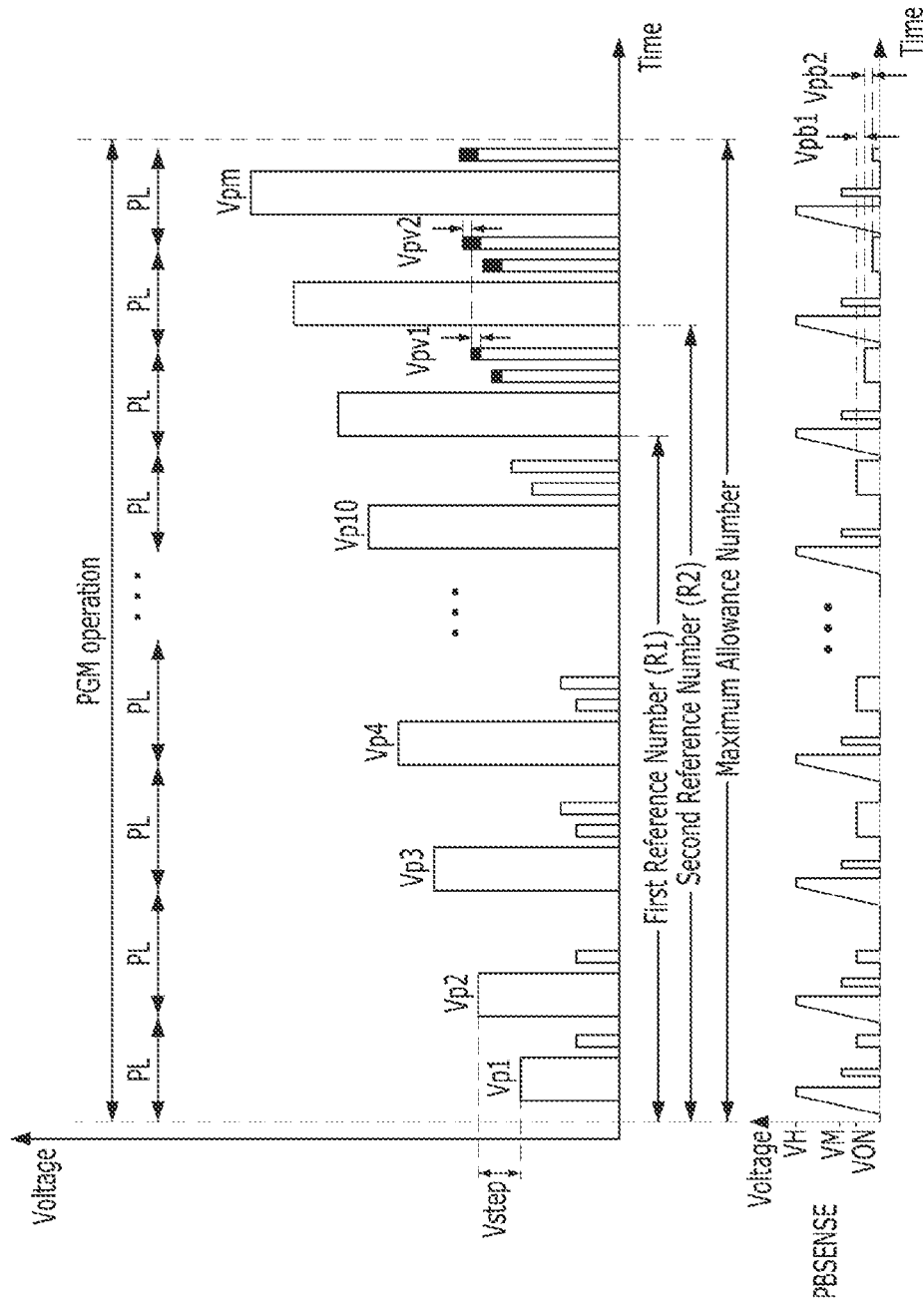

FIGS. 10A and 10B are timing diagrams illustrating a program operation in accordance with another embodiment of the present disclosure.

Referring to FIG. 10A, a program operation in a case in which a memory cell stores data of two bits or more is illustrated. When the number of program loops that are performed exceeds a reference number, a voltage level of a sensing control signal PBSENSE during a program verification operation may be reduced by a predetermined first level Vpb from a turn-on voltage VON. At this time, a level of a verification voltage that is applied to a selected word line may be increased by a third level Vpv compared to a verification voltage of the previous program loop. For example, as shown in FIG. 10A, when the reference number is set to 10, the voltage level of the sensing control signal PBSENSE in the program verification operation from the 11th program loop may be reduced by the first level Vpb compared to the sensing control signal PBSENSE of the previous program loop (i.e., the 10th program loop), and the level of the verification voltage in the program verification operation from the 11th program loop may be reduced by the third level Vpv compared to the verification voltage of the previous program loop (i.e., the 10th program loop). Accordingly, it is possible to reduce the internal current consumption and prevent the shift of the threshold voltage distribution of the memory cells.

Referring to FIG. 10B, a program operation in a case in which a memory cell stores data of two bits or more is illustrated. When the number of program loops that are performed exceeds a first reference number (R1) and smaller than or equal to a second reference number (R2), a voltage level of a sensing control signal PBSENSE, during a program verification operation of a program loop PL, may be reduced by a first level Vpb1. At this time, a level of a verification voltage that is applied to a selected word line may be increased by a third level Vpv1 compared to a verification voltage of the previous program loop. Further, when the number of program loops that are performed exceeds the second reference number (R2), the voltage level of the sensing control signal PBSENSE, during the program verification operation of the program loop PL, may be reduced by a second level Vpb2. At this time, the level of the verification voltage that is applied to the selected word line may be increased by a fourth level Vpv2 compared to that of the previous program loop.

For example, as shown in FIG. 10B, when the first reference number (R1) is set to 10 and the second reference number (R2) is set to 11, the voltage level of the sensing control signal PBSENSE in the program verification operation from the 11$^{th}$ program loop may be reduced by the first level Vpb1 compared to the sensing control signal PBSENSE of the previous program loop (i.e., the 10$^{th}$ program loop), and the level of the verification voltage may be increased by the third level Vpv1 compared to that of the previous program loop (i.e., the 10$^{th}$ program loop). Furthermore, the voltage level of the sensing control signal PBSENSE in the program verification operation from the 12$^{th}$ program loop may be reduced by the second level Vpb2 compared to the sensing control signal PBSENSE of the previous program loop (i.e., the 11$^{th}$ program loop), and the level of the verification voltage may be increased by the fourth level Vpv2 compared to that of the previous program loop (i.e., the 11$^{th}$ program loop). Accordingly, it is possible to reduce the internal current consumption and prevent the program performance degradation.

Figure 11:
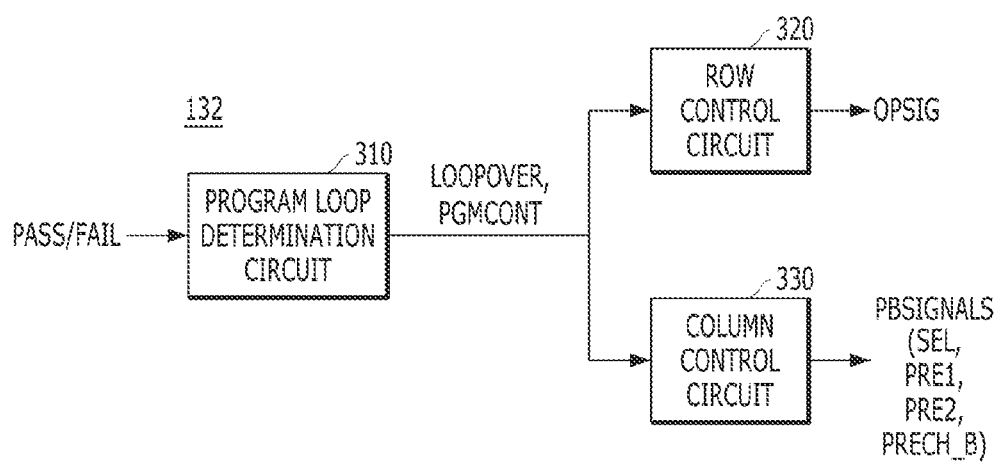
FIG. 11 is a configuration diagram illustrating a program control circuit of FIG. 2, in accordance with an embodiment of the present disclosure.

FIG. 11 is a configuration diagram illustrating the program control circuit 132 of FIG. 2, in accordance with an embodiment of the present disclosure.

Referring to FIG. 11, the program control circuit 132 may include a program loop determination circuit 310, a row control circuit 320, and a column control circuit 330.

The program loop determination circuit 310 may receive, from the sensing circuit 126, the pass or fail signal PASS/FAIL denoting whether a program verification operation has passed or failed. The program loop determination circuit 310 may determine whether to continue the program loop according to the pass or fail signal PASS/FAIL. For example, the program loop determination circuit 310 may generate a program control signal PGMCONT notifying the start of the next program loop according to the fail signal FAIL indicating that the program verification operation fails. The program loop determination circuit 310 may enable a loop control signal LOOPOVER when the number of program loops that are performed exceeds a preset reference number. According to an embodiment, when a plurality of reference numbers are set, the program loop determination circuit 310 may generate a plurality of loop control signals LOOPOVER for distinguishing the reference numbers. Meanwhile, the program loop determination circuit 310 may notify that a program operation for a selected word line fails when the number of program loops that are performed reaches a maximum allowable number.

The row control circuit 320 may output the operation signal OPSIG to the voltage generation circuit 122 in response to the program control signal PGMCONT. The voltage generation circuit 122 may generate the operating voltages Vop according to the operation signal OPSIG. For example, the voltage generation circuit 122 may generate and provide a program voltage to the row decoder 121 by increasing a level of the program voltage by a predetermined step voltage Vstep during a program voltage application operation. The row decoder 121 may apply the program voltage that is increased by the step voltage Vstep to the selected word line. In an embodiment, when the loop control signals LOOPOVER is enabled, the row control circuit 320 may output the operation signal OPSIG to the voltage generation circuit 122, such that a level of a verification voltage is increased by a predetermined level Vpv1 or Vpv2. Thus, the row decoder 121 may apply the verification voltage that is increased by the predetermined level Vpv1 or Vpv2 when the number of program loops that are performed exceeds the reference number.

The column control circuit 330 may output the page buffer control signals PBSIGNALS to the page buffer group 123 in response to the program control signal PGMCONT. During the program voltage application operation, the first to n-th page buffers PB1 to PBn of the page buffer group 123 may apply a program permission voltage to bit lines of program target cells and may apply a program inhibit voltage to bit lines of program inhibit cells according to the page buffer control signals PBSIGNALS. The page buffer control signals PBSIGNALS that are provided from the column control circuit 330 may include a precharge signal PRECH_B, a selection signal SEL, and first and second preliminary control signals PRE1 and PRE2.

In an embodiment the column control circuit 330 may provide the first preliminary control signal PRE1 to adjust the voltage level of the sensing control signal PBSENSE, while providing the second preliminary control signal PRE2 to reduce the voltage level of the sensing control signal PBSENSE during the program verification operation when the loop control signal LOOPOVER is enabled. In addition, the column control circuit 330 may provide the selection signal SEL for selecting the second preliminary control signal PRE2 when the loop control signal LOOPOVER is enabled. Thus, when the number of program loops that are performed exceeds the reference number, the first to n-th page buffers PB1 to PBn may adjust the level of the precharge voltage that is applied to the bit lines, during the program verification operation, according to the sensing control signal PBSENSE.

Figure 12:
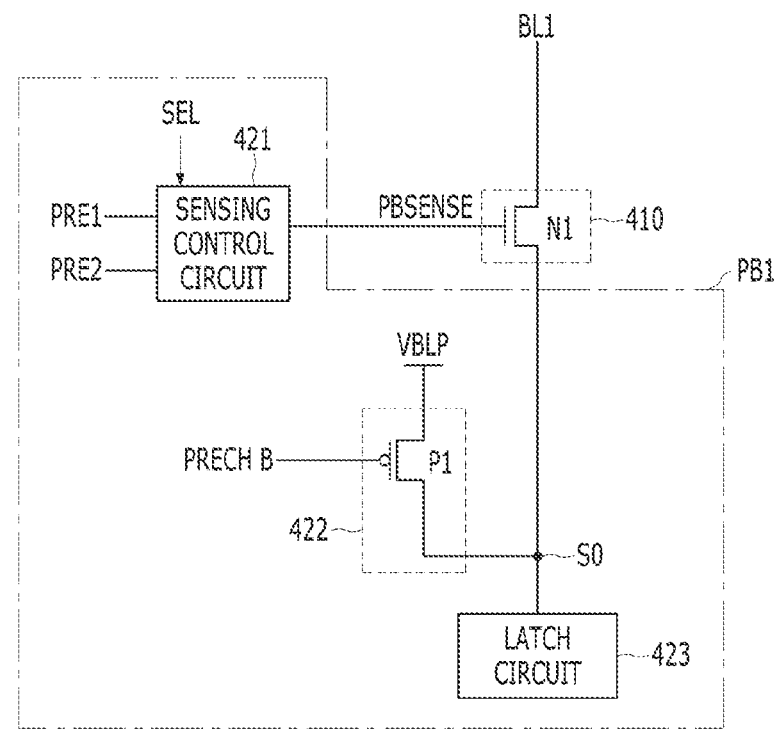
FIG. 12 is a configuration diagram illustrating a page buffer in accordance with an embodiment of the present disclosure.

FIG. 12 is a configuration diagram illustrating the first page buffer PB1 of the page buffer group 123 in accordance with an embodiment of the present disclosure.

Referring to FIG. 12, the first page buffer PB1 and the switch 410 are shown.

The switch 410 may coupled the first bit line BL1 and the first page buffer PB1 according to the sensing control signal PBSENSE. For example, the switch 410 may be implemented with an NMOS transistor N1 having a gate that receives the sensing control signal PBSENSE and may be coupled between the first bit line BL1 and a sensing node S0. The present invention, however, is not limited to the embodiment, and the switch 410 may be implemented as various types of transistors depending on circuit configuration.

The first page buffer PB1 may include a sensing control circuit 421, a precharge circuit 422, and a latch circuit 423.

The sensing control circuit 421 may generate the sensing control signal PBSENSE, corresponding to the first preliminary control signal PRE1 or the second preliminary control signal PRE2, in response to the selection signal SEL. The first and second preliminary control signals PRE1 and PRE2 may be signals for the voltage level of the sensing control signal PBSENSE and may swing to a high voltage (VH) level, a middle voltage (VM), and a turn-on voltage (VON) level, as described in FIGS. 7, 9, 10A, and 10B. In particular, the sensing control circuit 421 may select the second preliminary control signal PRE2 in response to the selection signal SEL, to thereby decrease the voltage level of the sensing control signal PBSENSE according to the second preliminary control signal PRE2, during the program verification operation.

The precharge circuit 422 may precharge the sensing node S0 to a precharge voltage VBLP according to the precharge signal PRECH_B. The precharge voltage VBLP may be a power supply voltage. For example, the precharge circuit 422 may be implemented with a PMOS transistor P1 having a gate that receives the precharge signal PRECH_B and may be coupled between a precharge voltage (VBLP) terminal and the sensing node S0. The present invention, however, is not limited to the embodiment, and the precharge circuit 422 may be implemented as various types of transistors depending on circuit configuration.

The latch circuit 423 may store data at the sensing node S0. The number of latches may vary according to the number of data bits that the memory cell may store.

As the precharge signal PRECH_B is enabled to a logic low level during the program verification operation, the precharge circuit 422 may be turned on to precharge the sensing node S0 to the precharge voltage VBLP. During the program verification operation, the sensing control circuit 421 may decrease the voltage level of the sensing control signal PBSENSE according to the second preliminary control signal PRE2. The switch 410 may be turned on to electrically couple the first bit line BL1 to the sensing node S0, and the first bit line BL1 may be precharged to the precharge voltage VBLP. At this time, a level at which the first bit line BL1 is precharged may vary depending on the voltage level of the sensing control signal PBSENSE that is applied to the switch 410. That is, as the voltage level (driving force) of the sensing control signal PBSENSE decreases, the driving force of the switch 410 decreases, and thus, the precharge voltage that is applied to the first bit line BL1 may decrease.

Meanwhile, in the above-described embodiments, a case in which a memory cell stores data of two bits or more has been described as an example, but the present invention is not limited to the embodiment. Hereinafter, in an embodiment of the present invention, when the memory cell is a single-level cell (SLC) storing data of a single bit, a method of reducing the internal current consumption by reducing a level of a precharge voltage that is applied to bit lines during a program verification operation until the number of program loops that are performed reaches a preset reference number will be described.

Figure 13:
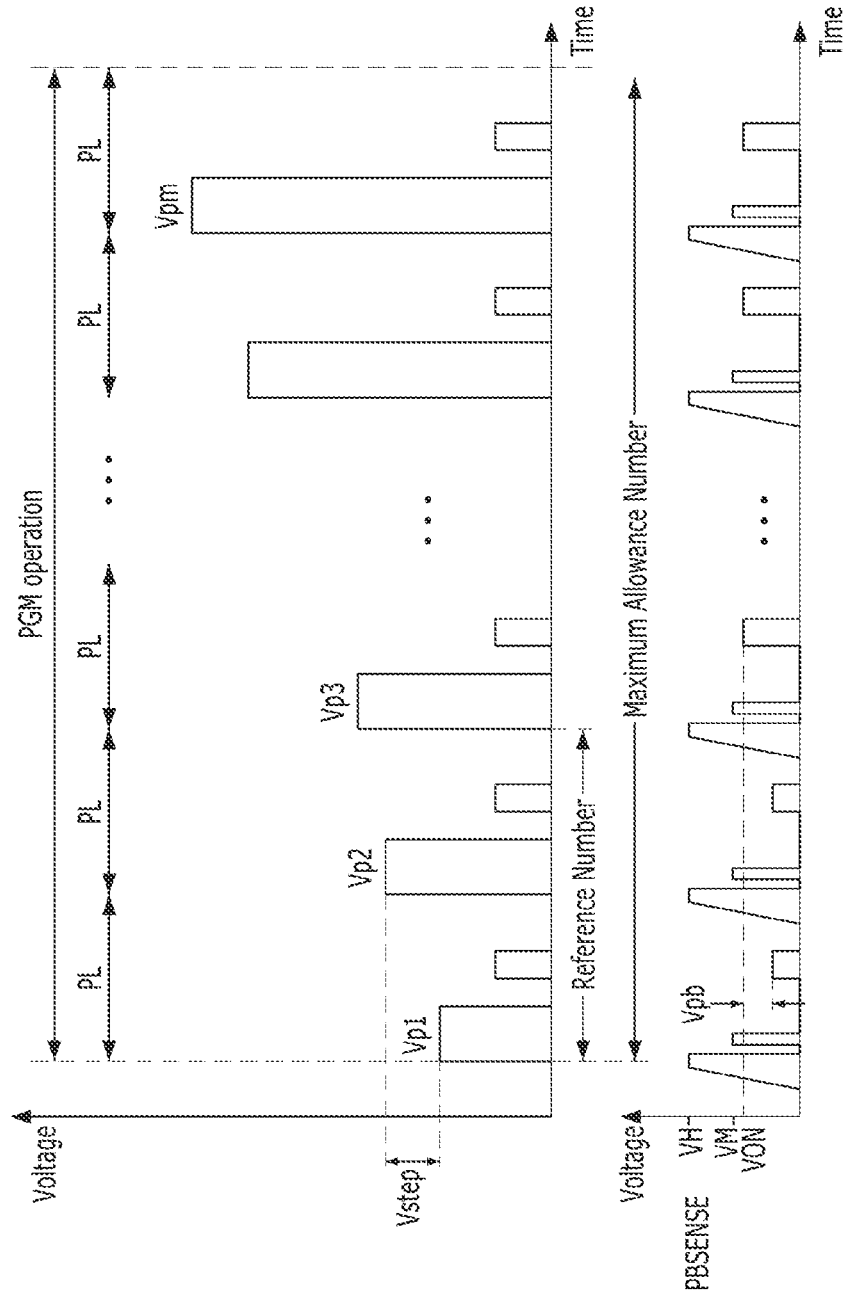
FIG. 13 is a flow chart for describing a program operation in accordance with an embodiment of the present disclosure.

FIG. 13 is a flow chart for describing a program operation in accordance with an embodiment of the present disclosure.

Referring to FIG. 13, a program operation in a case in which a memory cell is a single-level cell (SLC) is illustrated. The program operation may be performed by repeating at least one program loop PL within a maximum allowance number of times (e.g., m times).

In case of the SLC, the control logic 130 may control a voltage level of a sensing control signal PBSENSE to be reduced by a predetermined first level Vpb from a turn-on voltage VON, during the program verification operation, when the number of program loops that are performed is smaller than or equal to a reference number. When number of program loops that are performed is greater than the reference number, the control logic 130 may control the voltage level of the sensing control signal PBSENSE to become a level of the turn-on voltage VON. For example, as shown in FIG. 13, when the reference number is set to 2, the voltage level of the sensing control signal PBSENSE may be set to be reduced by the first level Vpb from the turn-on voltage VON during the program verification operation of the first and second program loops. From the third program loop, the voltage level of the sensing control signal PBSENSE may be increased by the first level Vpb compared to the sensing control signal PBSENSE of the previous program loop (i.e., the first and second program loops), and thus, the voltage level of the sensing control signal PBSENSE may be set to a level of the turn-on voltage VON. Accordingly, in the case of the SLC, when the number of program loops that are performed is smaller than or equal to the reference number, a level of a precharge voltage that is applied to bit lines may be set to be reduced by a first level Vpre during the program verification operation, thereby reducing the internal current consumption that is generated during the program verification operation and stabilizing the average current consumption.

In case of the SLC, the column control circuit 330 of the program control circuit 132 of FIG. 11 may provide the first preliminary control signal PRE1 to adjust the voltage level of the sensing control signal PBSENSE, while providing the second preliminary control signal PRE2 to increase the voltage level of the sensing control signal PBSENSE during the program verification operation when the loop control signal LOOPOVER is enabled. At this time, the column control circuit 330 may provide the first preliminary control signal PRE1 to reduce the voltage level of the sensing control signal PBSENSE by the first level Vpb from the turn-on voltage VON during the program verification operation. The sensing control circuit 421 of the first page buffer PB1 may generate the sensing control signal PBSENSE corresponding to the first preliminary control signal PRE1 or the second preliminary control signal PRE2. That is, when the number of program loops that are performed is smaller than or equal to the reference number, the sensing control circuit 421 may decrease the voltage level of the sensing control signal PBSENSE by the first level Vpb from the turn-on voltage VON, during the program verification operation, according to the first preliminary control signal PRE1. As the voltage level (driving force) of the sensing control signal PBSENSE decreases, the driving force of the switch 410 decreases, and thus, the precharge voltage that is applied to the first bit line BL1 may decrease. Further, when the number of program loops that are performed is greater than the reference number, the sensing control circuit 421 may set the voltage level of the sensing control signal PBSENSE to a level of the turn-on voltage VON.

Meanwhile, depending on an embodiment, in case of the SLC, when the number of program loops that are performed is smaller than or equal to the reference number, the control logic 130 may control the peripheral circuit 120 such that a level of a verification voltage that is applied to a selected word line during the program verification operation is increased by a predetermined level.

Depending on an embodiment, in the case of the SLC, a plurality of reference numbers may be set, and the control logic 130 may control the peripheral circuit 120 such that an initial level of the precharge voltage is set to be lower. Further, the control logic 130 may control the peripheral circuit 120 such that a level of the precharge voltage becomes sequentially increased whenever the number of program loops that are performed exceeds each reference number, thereby finally reaching the level of the turn-on voltage VON. Accordingly, the average current consumption may be stabilized by reducing the internal current consumption that is generated during the program verification operation.

Figure 14A:
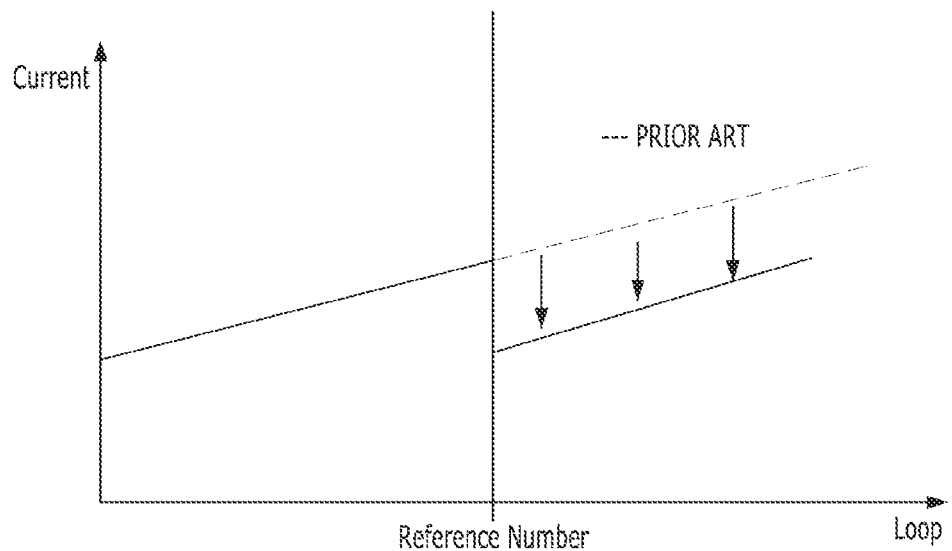
FIGS. 14A and 14B are graphs showing current consumption according to a program loop according to an embodiment of the present invention.
Figure 14B:
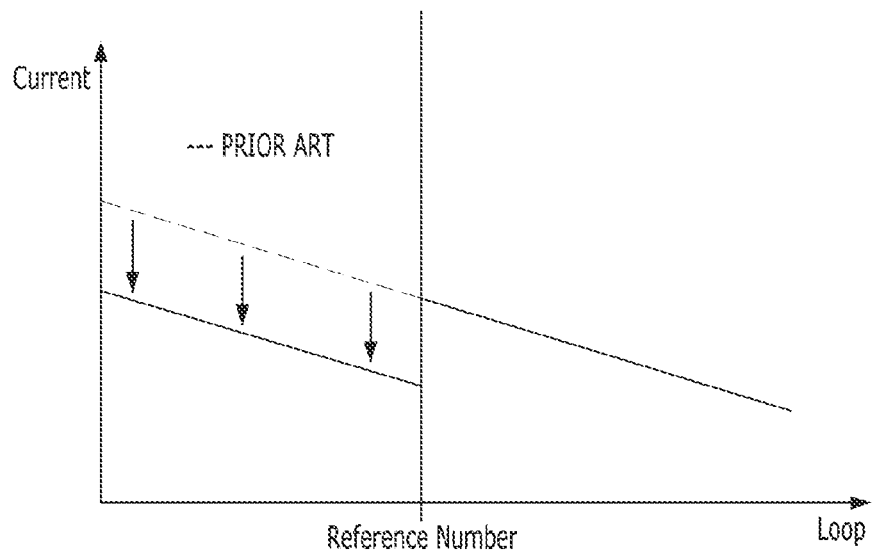

FIGS. 14A and 14B are graphs showing current consumption according to a program loop according to an embodiment of the present invention.

Referring to FIG. 14A, in the case in which a memory cell stores data of two bits or more, current that is consumed according to a program loop during a program verification operation is shown. In the case of a multi-level cell, as opposed to the prior art (shown in a dotted line), the increasing current consumption may be decreased toward a second half of the program loop in comparison to the dotted line during the program verification operation. According to an embodiment of the present invention, the current consumption during the program verification operation may be minimized by decreasing a level of a precharge voltage when the number of program loops that are performed exceeds a reference number.

Referring to FIG. 14B, in the case in which a memory cell stores data of a single bit, a current consumed according to a program loop during a program verification operation is shown. In the case of a single-level cell, as opposed to the prior art (shown in a dotted line), the decreasing current consumption may be decreased in a first half of the program loop in comparison to the dotted line during the program verification operation. According to an embodiment of the present invention, the current consumption during the program verification operation may be minimized by lowering a level of a precharge voltage when the number of program loops that are performed is smaller than or equal to a reference number.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal. Furthermore, the embodiments may be combined to form additional embodiments.

What is claimed is:

1. A memory device, comprising:
a memory cell array including a plurality of memory cells;
a peripheral circuit coupled to the memory cell array through word lines and bit lines and suitable for performing one or more program loops on memory cells that are coupled to a selected word line of the word lines, each program loop including a program voltage application operation and a program verification operation; and
a program control circuit suitable for controlling the peripheral circuit to decrease a level of a precharge voltage that is applied to the bit lines during the program verification operation, when the number of program loops that are performed is greater than a reference number,
wherein the peripheral circuit includes:
a plurality of page buffers suitable for applying the precharge voltage to the bit lines during the program verification operation; and
a plurality of switches suitable for respectively coupling the bit lines and the page buffers in response to a sensing control signal,
wherein the program control circuit is suitable for controlling a voltage level of the sensing control signal to be decreased when the number of program loops that are performed is greater than the reference number.

2. The memory device of claim 1, wherein, when the number of program loops that are performed is greater than the reference number, the program control circuit is suitable for controlling the peripheral circuit to increase a level of a verification voltage that is applied to the selected word line compared to that of a preceding program loop during the program verification operation.

3. The memory device of claim 1, wherein the program control circuit is suitable for:
controlling the level of the precharge voltage to be lower than that of a preceding program loop when the number of program loops that are performed is greater than a first reference number and smaller than or equal to a second reference number, and
controlling the level of the precharge voltage to be lower than that of a preceding program loop, when the number of program loops that are performed is greater than the second reference number.

4. The memory device of claim 3, wherein the program control circuit is suitable for:
controlling a level of a verification voltage that is applied to the selected word line during the program verification operation to be increased compared to that of a preceding program loop when the number of program loops that are performed is greater than the first reference number and smaller than or equal to the second reference number, and controlling the level of the verification voltage to be increased compared to that of a preceding program loop when the number of program loops that are performed is greater than the second reference number.

5. The memory device of claim 1, wherein each of the memory cells stores data of two bits or more.

6. A memory device, comprising:
a memory cell array including a plurality of memory cells;
a peripheral circuit coupled to the memory cell array through word lines and bit lines, and suitable for performing one or more program loops on memory cells that are coupled to a selected word line of the word lines, each program loop including a program voltage application operation and a program verification operation; and
a program control circuit suitable for controlling the peripheral circuit to decrease a level of a precharge voltage that is applied to the bit lines during the program verification operation, when the number of program loops that are performed is smaller than or equal to a reference number,
wherein the peripheral circuit includes:
a plurality of page buffers suitable for applying the precharge voltage to the bit lines during the program verification operation; and
a plurality of switches suitable for respectively coupling the bit lines and the page buffers in response to a sensing control signal,
wherein the program control circuit is suitable for controlling a voltage level of the sensing control signal to be decreased when the number of program loops that are performed is smaller than or equal to the reference number.

7. The memory device of claim 6, wherein, when the number of program loops that are performed is smaller than or equal to the reference number, the program control circuit is suitable for controlling the peripheral circuit to increase a level of a verification voltage that is applied to the selected word line compared to that of a preceding program loop during the program verification operation.

8. The memory device of claim 6, wherein each of the memory cells includes a single-level cell (SLC).

9. A program method of a memory device, comprising:
setting a program permission voltage and a program inhibit voltage of a plurality of bit lines;
performing a program voltage application operation of applying a program voltage to memory cells that are coupled to a selected word line of a plurality of word lines; and
performing a program verification operation of verifying a program result by precharging the bit lines using a precharge voltage and applying a verification voltage to the memory cells that are coupled to the selected word line,
wherein the setting, the program voltage application operation, and the program verification operation are repeatedly performed, and
wherein a level of the precharge voltage is decreased while increasing a level of the verification voltage compared to that of a preceding program loop, during the program verification operation, when the number of program loops that are performed is greater than a reference number, each program loop including the program voltage application operation and the program verification operation.

10. The program method of claim 9, wherein the level of the precharge voltage during the program verification operation is decreased by:
decreasing the level of the precharge voltage by a first level compared to a preceding program loop when the number of program loops that are performed is greater than a first reference number and smaller than or equal to a second reference number, and
decreasing the level of the precharge voltage by a second level compared to a preceding program loop when the number of program loops that are performed is greater than the second reference number.

11. The program method of claim 10, further comprising:
increasing a level of the verification voltage by a third level during the program verification operation compared to that of a preceding program loop when the number of program loops that are performed is greater than the first reference number and smaller than or equal to the second reference number, and
increasing a level of the verification voltage by a fourth level during the program verification operation compared to that of a preceding program loop when the number of program loops that are performed is greater than the second reference number.

12. The program method of claim 9, wherein each of the memory cells stores data of two bits or more.

13. The program method of claim 9, wherein the program loop may be performed by an incremental step pulse program (ISPP) scheme.

14. A program method of a memory device, comprising:
setting a program permission voltage and a program inhibit voltage of a plurality of bit lines;
performing a program voltage application operation of applying a program voltage to memory cells that are coupled to a selected word line of a plurality of word lines; and
performing a program verification operation of verifying a program result by precharging the bit lines using a precharge voltage and applying a verification voltage to the memory cells that are coupled to the selected word line,
wherein the setting, the program voltage application operation, and the program verification operation are repeatedly performed, and
wherein a level of the precharge voltage is decreased while increasing a level of the verification voltage compared to that of a preceding program loop, during the program verification operation, when the number of program loops that are performed is smaller than or equal to a reference number, each program loop including the program voltage application operation and the program verification operation.

15. The program method of claim 14, wherein each of the memory cells includes a single-level cell (SLC).

* * * * *